United States Patent
Foletto et al.

(10) Patent No.: US 9,175,981 B2
(45) Date of Patent: *Nov. 3, 2015

(54) MOTION SENSOR, METHOD, AND COMPUTER-READABLE STORAGE MEDIUM PROVIDING A MOTION SENSOR GENERATING A SIGNAL HAVING SIGNAL STATES WITH A REDUCED AMOUNT OF STATE CHATTER

(71) Applicant: Allegro Microsystems, LLC, Worcester, MA (US)

(72) Inventors: Andrea Foletto, Annecy (FR); Devon Fernandez, Londonderry, NH (US); Eric Burdette, Newmarket, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 266 days.

This patent is subject to a terminal disclaimer.

(21) Appl. No.: 13/859,245

(22) Filed: Apr. 9, 2013

(65) Prior Publication Data

US 2013/0226490 A1 Aug. 29, 2013

Related U.S. Application Data

(63) Continuation of application No. 12/793,159, filed on Jun. 3, 2010, now Pat. No. 8,450,996.

(51) Int. Cl.
*G01B 7/30* (2006.01)
*G01D 5/12* (2006.01)
(Continued)

(52) U.S. Cl.
CPC ................ *G01D 5/12* (2013.01); *G01D 5/145* (2013.01); *G01D 5/2448* (2013.01); *G01P 3/487* (2013.01); *G01P 3/488* (2013.01); *G01P 3/489* (2013.01); *G01P 21/02* (2013.01); *G01R 25/005* (2013.01)

(58) Field of Classification Search
CPC ....... G01D 5/12; G01D 5/145; G01D 5/2448; G01P 21/02; G01P 3/487; G01P 3/488; G01P 3/489; G01R 25/005
USPC .......................... 324/173–174, 207.2–207.26
See application file for complete search history.

(56) References Cited

U.S. PATENT DOCUMENTS

| | | |
|---|---|---|
| 5,594,241 A | 1/1997 | Li et al. |
| 5,694,038 A | 12/1997 | Moody et al. |

(Continued)

FOREIGN PATENT DOCUMENTS

| | | |
|---|---|---|
| EP | 0 875 733 A2 | 11/1998 |
| EP | 0 875 733 A3 | 11/1998 |

(Continued)

OTHER PUBLICATIONS

European Notice of Allowance dated Dec. 4, 2013; for European Pat. App. No. 11 720 260.6; 7 pages.

(Continued)

*Primary Examiner* — Jay Patidar
(74) *Attorney, Agent, or Firm* — Daly, Crowley, Mofford & Durkes, LLP

(57) ABSTRACT

A motion sensor has a state processor to identify states associated with a magnetic field signal provided by a magnetic field sensing element. The state processor includes a state peak logic module configured to generate a signal having signal states that have a reduced amount of state chatter.

30 Claims, 23 Drawing Sheets

(51) Int. Cl.
*G01D 5/14* (2006.01)
*G01D 5/244* (2006.01)
*G01P 3/487* (2006.01)
*G01P 3/488* (2006.01)
*G01P 3/489* (2006.01)
*G01R 25/00* (2006.01)
*G01P 21/02* (2006.01)

(56) References Cited

U.S. PATENT DOCUMENTS

| | | | |
|---|---|---|---|
| 5,917,320 | A | 6/1999 | Scheller et al. |
| 6,091,239 | A | 7/2000 | Vig et al. |
| 6,411,080 | B1 | 6/2002 | Bach et al. |
| 6,693,419 | B2 | 2/2004 | Stauth et al. |
| 6,815,944 | B2 | 11/2004 | Vig et al. |
| 7,026,808 | B2 | 4/2006 | Vig et al. |
| 7,046,000 | B1 | 5/2006 | Hara et al. |
| 7,138,793 | B1 | 11/2006 | Bailey |
| 7,253,614 | B2 | 8/2007 | Forrest et al. |
| 7,365,530 | B2 | 4/2008 | Bailey et al. |
| 7,592,801 | B2 | 9/2009 | Bailey et al. |
| 7,622,914 | B2 | 11/2009 | Bailey et al. |
| 2005/0225318 | A1 | 10/2005 | Bailey et al. |
| 2009/0153137 | A1 | 6/2009 | Bailey et al. |
| 2010/0013467 | A1 | 1/2010 | Hara et al. |
| 2010/0026279 | A1 | 2/2010 | Vig et al. |
| 2010/0181993 | A1 | 7/2010 | Fernandez et al. |

FOREIGN PATENT DOCUMENTS

| | | |
|---|---|---|
| GB | 2 067 295 A | 7/1981 |
| GB | 2 334 636 A | 8/1999 |
| JP | S64-031019 | 1/1989 |
| WO | WO 2006/101702 A1 | 9/2006 |
| WO | WO 2007/120395 A1 | 10/2007 |
| WO | WO 2008/020231 A2 | 2/2008 |
| WO | WO 2008/020231 A3 | 2/2008 |

OTHER PUBLICATIONS

EP Response Dated Jan. 15, 2015; for European Pat. App. No. 14158023.3; 24 pages.
EP Response Dated Jan. 15, 2015; for European Pat. App. No. 14161984.1; 38 pages.
Letter to Yuasa and Hara dated Jan. 15, 2015; for U.S. Pat. App. No. 2013-513174; 2 pages.
Claims filed with Japanese response on Feb. 10, 2015; for U.S. Pat. App. No. 2013-513174; 5 pages.
Office Action dated Oct. 9, 2012; for U.S. Appl. No. 12/793,159; 13 pages.
Response filed Jan. 9, 2013; to Office Action dated Oct. 9, 2012; for U.S. Appl. No. 12/793,159; 14 pages.
Notice of Allowance dated Feb. 8, 2013; for U.S. Appl. No. 12/793,159; 7 pages.
European Official Communication dated Jan. 4, 2013; for European Pat. App. No. 11720260.6; 2 pages.
European Decision to Grant Patent dated Apr. 3, 2014; for European Pat. App. No. 11720260.6; 2 pages.
Japanese Notice of Reason for Rejection (English Translation) dated Nov. 18, 2014; for Japanese Pat. App. No. 2013-513174; 1 page.
Japanese Notice of Reasons for Rejection (English translation) dated Dec. 25, 2014, for Japanese Pat. App. No. 2010-530006; 2 pages.
European Search Report dated Jul. 1, 2014; for European Pat. App. No. 14158023.3; 7 pages.
European Search Report dated Jul. 1, 2014; for European Pat. App. No. 14161984.1; 7 pages.
Allegro Data Sheet ATS651LSH; "Two-Wire Self-Calibrating Differential Speed and Direction Sensor IC with Vibration Immunity;" Oct. 1, 2006; 13 sheets.
Allegro Data Sheet ATS657; "Dynamic, Self-Calibrating, Threshold-Detecting, Differential Speed and Direction Hall-Effect Gear Tooth Sensor IC;" May 20, 2008; 15 sheets.
Allegro Data Sheet ATS693LSG; "Three-Wire Differential, Vibration Resistant Sensor IC with Speed and Direction Output;" Jan. 28, 2010; 10 sheets.
Price Quote; Part No. ATS693LSGTN-T; Jan. 27, 2010; 1 sheet.
Allegro Slide Presentation to Customer; Allegro Automotive Portfolio 2010; Jan. 28, 2010; 5 sheets.
PCT Search Report and Written Opinion; dated Aug. 26, 2011; for PCT Pat. App. No. PCT/US2011/035142; 11 pages.
PCT International Preminary Report of Patentability and Written Opinion of the ISA; dated Dec. 13, 2012; for PCT Pat. App. No. PCT/US2011/035142; 9 pages.
PCT Search Report and Written Opinion of the ISA; dated Aug. 17, 2011; for PCT Pat. App. No. PCT/US2011/035140; 10 pages.
PCT Search Report and Written Opinion of the ISA dated Aug. 23, 2011 for PCT Pat. App. No. PCT/US2011/035137; 11 pages.
Letters from Yuasa and Hara (including claims translated into English) dated Mar. 26, 2014; for Japanese Pat. App. No. 2013-513174; 8 pages.
Japanese Request for Examination and Voluntary Amendment filed Mar. 4, 2014; for Japanese Pat. App. No. 2013-513174; 7 pages.
Response filed Jul. 9, 2013; to European Official Communication dated Jan. 4, 2013; for EP Pat. App. No. 11720260.6; 18 pages.
Office Action dated Apr. 10, 2015; for U.S. Appl. No. 14/259,662; 15 pages.
Response filed Jun. 8, 2015; to Office Action dated Apr. 10, 2015; for U.S. Appl. No. 14/259,662; 22 pages.
Notice of Allowance dated Jul. 7, 2015; for U.S. Appl. No. 14/259,662; 6 pages.

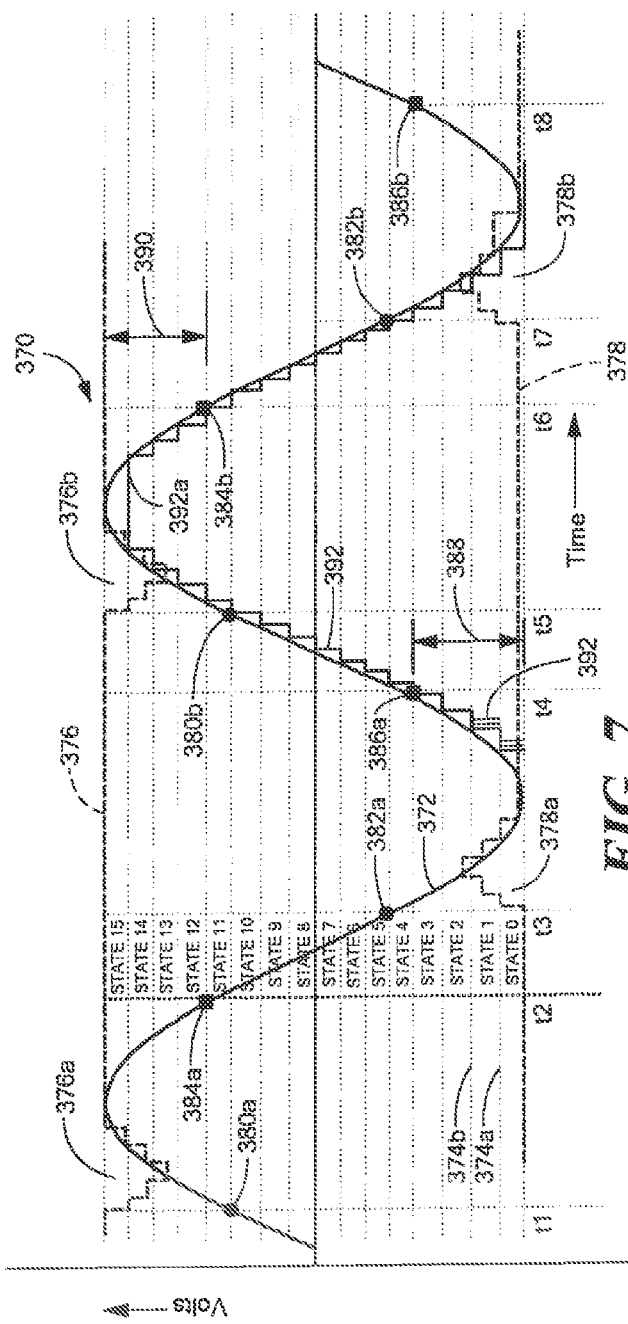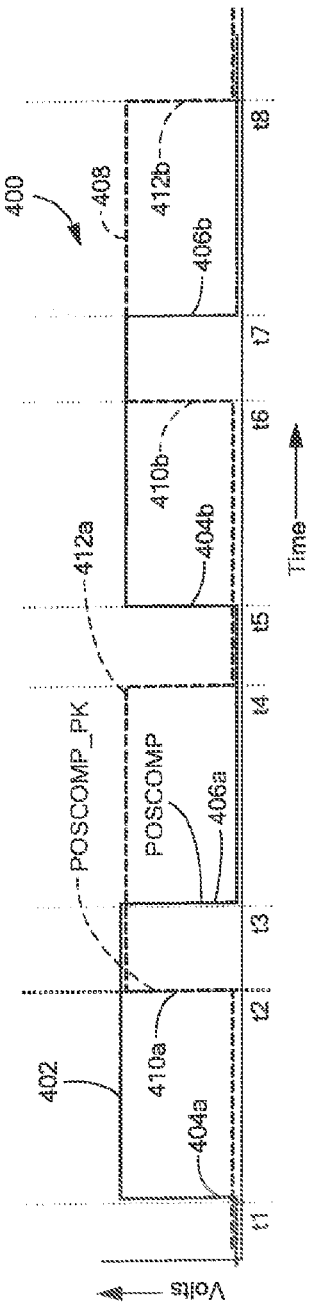

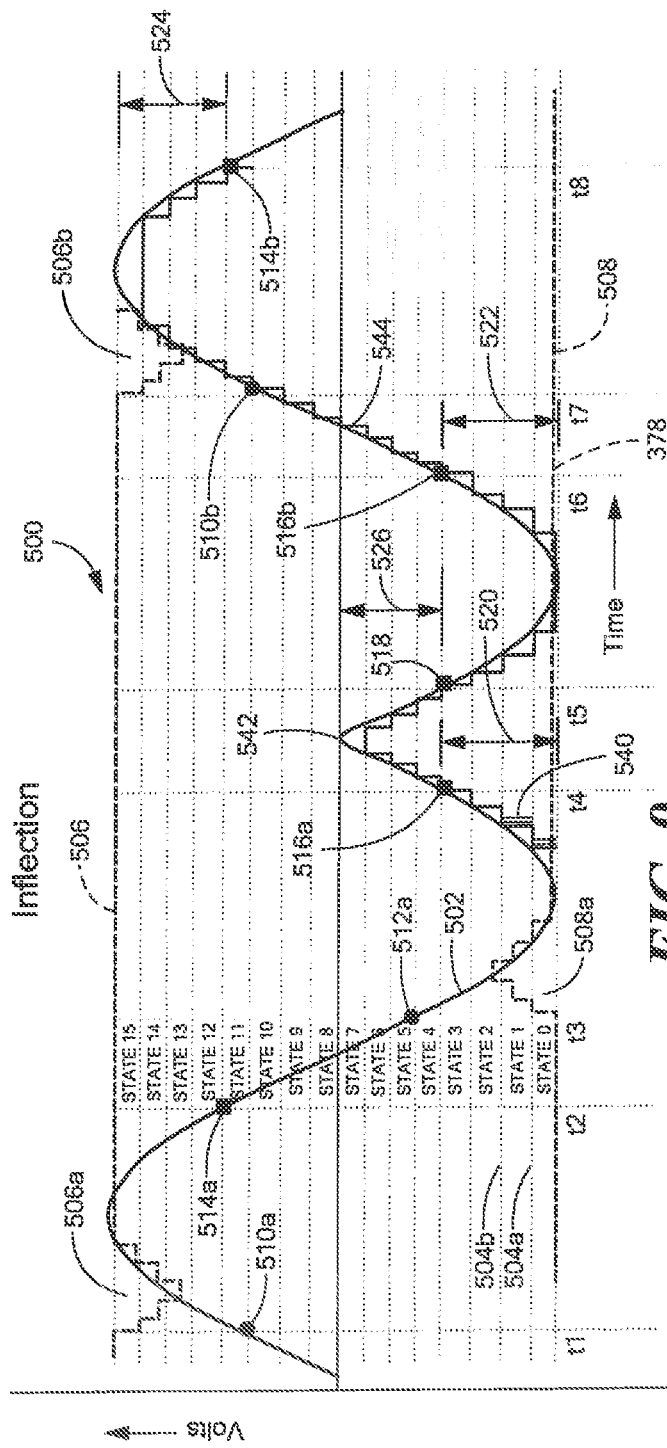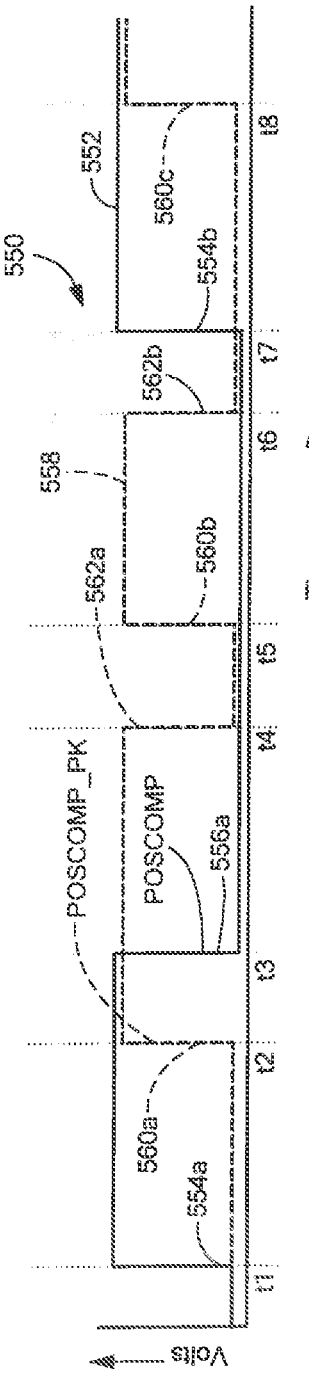

MOTION SENSOR, METHOD, AND COMPUTER-READABLE STORAGE MEDIUM PROVIDING A MOTION SENSOR GENERATING A SIGNAL HAVING SIGNAL STATES WITH A REDUCED AMOUNT OF STATE CHATTER

CROSS REFERENCE TO RELATED APPLICATIONS

This application is a Continuation application of and claims the benefit of and priority to U.S. patent application Ser. No. 12/793,159, filed Jun. 3, 2010, which application is incorporated by reference herein in its entirety.

STATEMENT REGARDING FEDERALLY SPONSORED RESEARCH

Not Applicable.

FIELD OF THE INVENTION

This invention relates to motion sensors, and more particularly, to a motion sensor that has a state processor.

BACKGROUND OF THE INVENTION

Magnetic field sensors (e.g., rotation detectors) for detecting ferromagnetic articles and/or magnetic articles are known. The magnetic field associated with the ferromagnetic article or magnetic article is detected by a magnetic field sensing element, such as a Hall element or a magnetoresistance element, which provides a signal (i.e., a magnetic field signal) proportional to a detected magnetic field. In some arrangements, the magnetic field signal is an electrical signal.

The magnetic field sensor processes the magnetic field signal to generate an output signal that, in some arrangements, changes state each time the magnetic field signal crosses thresholds, either near to peaks (positive and/or negative peaks) or near to some other level, for example, zero crossings of the magnetic field signal. Therefore, the output signal has an edge rate or period indicative of a speed of rotation of the ferromagnetic (e.g., ferrous) or magnetic object, for example, a gear or a ring magnet (either of which may or may not be ferrous).

One application for a magnetic field sensor is to detect the approach and retreat of each tooth of a rotating ferromagnetic gear, either a hard magnetic gear or a soft ferromagnetic gear. In some particular arrangements, a ring magnet having magnetic regions (permanent or hard magnetic material) with alternating polarity is coupled to the ferromagnetic gear or is used by itself and the magnetic field sensor is responsive to approach and retreat of the magnetic regions of the ring magnet. In other arrangements, a gear is disposed proximate to a stationary magnet and the magnetic field sensor is responsive to perturbations of a magnetic field as the gear rotates. Such arrangements are also referred to as proximity sensors or motion sensors. In the case of sensed rotation, the arrangements can be referred to as rotation sensors. As used herein, the terms "detector" and "sensor" are used to mean substantially the same thing.

In one type of magnetic field sensor, sometimes referred to as a peak-to-peak percentage detector (or threshold detector), one or more threshold levels are equal to respective percentages of the peak-to-peak magnetic field signal. One such peak-to-peak percentage detector is described in U.S. Pat. No. 5,917,320 entitled "Detection of Passing Magnetic Articles While Periodically Adapting Detection Threshold" and assigned to the assignee of the present invention.

Another type of magnetic field sensor, sometimes referred to as a slope-activated detector (or peak-referenced detector, or peak detector for short), is described in U.S. Pat. No. 6,091,239 entitled "Detection Of Passing Magnetic Articles With a Peak Referenced Threshold Detector," also assigned to the assignee of the present invention. In the peak-referenced magnetic field sensor, the threshold signal differs from the positive and negative peaks (i.e., the peaks and valleys) of the magnetic field signal by a predetermined amount. Thus, in this type of magnetic field sensor, the output signal changes state when the magnetic field signal comes away from a peak or valley of the magnetic field signal by the predetermined amount.

It should be understood that, because the above-described threshold detector and the above-described peak detector both have circuitry that can identify the positive and negative peaks of a magnetic field signal. The threshold detector and the peak detector, however, each use the detected peaks in different ways.

In order to accurately detect the positive and negative peaks of a magnetic field signal, the magnetic field sensor is capable of tracking at least part of the magnetic field signal. To this end, typically, one or more digital-to-analog converters (DACs) can be used to generate a tracking signal, which tracks the magnetic field signal. For example, in the above-referenced. U.S. Pat. Nos. 5,917,320 and 6,091,239, two DACs are used, one (PDAC) to detect the positive peaks of the magnetic field signal and the other (NDAC) to detect the negative peaks of the magnetic field signal.

The magnetic field associated with the ferromagnetic object and the resulting magnetic field signal are proportional to the distance between the ferromagnetic object, for example the rotating ferromagnetic gear, and the magnetic field sensing element(s), for example, the Hall elements, used in the proximity detector. This distance is referred to herein as an "air gap." As the air gap increases, the magnetic field sensing elements tend to experience a smaller magnetic field from the rotating ferromagnetic gear, and therefore smaller changes in the magnetic field generated by passing teeth of the rotating ferromagnetic gear.

Proximity detectors have been used in systems in which the ferromagnetic object (e.g., the rotating ferromagnetic gear) not only rotates, but also vibrates. For the ferromagnetic gear capable of rotation about an axis of rotation in normal operation, the vibration can have at least two vibration components. A first vibration component corresponds to a "rotational vibration," for which the ferromagnetic gear vibrates back and forth about its axis of rotation. A second vibration component corresponds to "translational vibration," for which the above-described air gap dimension vibrates. The rotational vibration and the translational vibration can occur even when the ferromagnetic gear is not otherwise rotating in normal operation. Both the first and the second vibration components, separately or in combination, can generate an output signal from the proximity detector that indicates rotation of the ferromagnetic gear even when the ferromagnetic gear is not rotating in normal operation.

Proximity detectors adapted to detect and to be responsive to rotational vibration and translational vibration are described, for example, in U.S. Pat. No. 7,365,530, issued Apr. 29, 2008, U.S. Pat. No. 7,592,801, issued Sep. 22, 2009, U.S. Pat. No, 7,622,914, issued Nov. 24, 2009, U.S. Pat. No. 7,253,614, issued Aug. 7, 2007, and U.S. patent application Ser. No. 12/338,048, filed Dec. 18, 2008, each of which are assigned to the assignee of the present invention.

Proximity detectors have been applied to automobile antilock brake systems (ABS) to determine rotational speed of automobile wheels. Proximity detectors have also been applied to automobile transmissions to determine rotating speed of transmission gears in order to shift the transmission at predetermined shift points and to perform other automobile system functions.

Magnetic field signals generated by the magnetic field sensing element during vibration can have characteristics that depend upon the nature of the vibration. For example, when used in an automobile transmission, during starting of the automobile engine, the proximity detector primarily tends to experience rotational vibration, which tends to generate magnetic field signals having a first wave shape. In contrast, during engine idle, the proximity detector primarily tends to experience translational vibration, which tends to generate magnetic field signals having a second wave shape. The magnetic field signals generated during a vibration can also change from time to time, or from application to application, e.g., from automobile model to automobile model.

It will be understood that many mechanical assemblies have size and position manufacturing tolerances. For example, when the proximity detector is used in an assembly, the air gap can have manufacturing tolerances that result in variation in magnetic field sensed by the magnetic field sensing elements used in the proximity detector when the ferromagnetic object is rotating in normal operation and a corresponding variation in the magnetic field signal. It will also be understood that the air gap can change over time as wear occurs in the mechanical assembly.

Some types of magnetic field sensors perform one or more types of initialization or calibration, for example, at a time near to start up or power up of the sensor, or otherwise, from time to time as desired. During one type of calibration, the above-described threshold level is determined. In some types of calibration, a time interval during which the calibration occurs is determined in accordance with a predetermined number of cycles of the magnetic field signal. Thus, for fast magnetic field signals (e.g. for fast rotating gears), the time available for calibration is small. In those applications for which the movement or rotation is rapid and the time available for calibration is small, the rotation detector might not calibrate properly, i.e., the threshold might not be properly determined.

Many of the characteristics of a magnetic field signal generated in response to a vibration can be the same as or similar to characteristics of a magnetic field signal generated during rotation of the ferromagnetic object in normal operation. For example, the frequency of a magnetic field signal generated during vibration can be the same as or similar to the frequency of a magnetic field signal generated during rotation in normal operation. As another example, the amplitude of a magnetic field signal generated in response to a vibration can be similar to the amplitude of a magnetic field signal generated during a rotation in normal operation. Therefore, the conventional proximity detector generates an output signal both in response to a vibration and in response to a rotation in normal operation. The output signal from the proximity detector can, therefore, appear the same, whether generated in response to a vibration or in response to a rotation in normal operation.

It may be adverse to the operation of a system, for example, an automobile system in which the proximity detector is used, for the system to interpret an output signal from the proximity detector to be associated with a rotation in normal operation when only a vibration is present. For example, an antilock brake system using a proximity detector to detect wheel rotation may interpret an output signal from the proximity detector to indicate a rotation of a wheel, when the output signal may be due only to a vibration. Therefore, the antilock brake system might not operate as intended.

It may also be undesirable to perform a proximity detector calibration in response to a vibration rather than in response to a rotation in normal operation. Calibration is further described below. Since the conventional proximity detector cannot distinguish a magnetic field signal generated in response to a rotation in normal operation from a magnetic field signal generated in response to a vibration, the proximity detector may perform calibrations at undesirable times when experiencing the vibration, and therefore, result in inaccurate calibration.

Due to noise (electrical or vibrational) the motion sensor may not accurately position edges of an output signal, which edge placements are representative of an absolute number of degrees of rotation of the sensed object. Also due to such noise, the motion sensor may generate an inaccurate output signal, particularly near to a time of power up when vibrations are highest, that has edges that are inaccurately placed.

Thus, it is desirable to provide a motion sensor that has improved edge placement (or other representation of rotational angle) in an output signal therefrom.

SUMMARY OF THE INVENTION

The motion sensor, methods, and computer-readable medium of the claimed invention provide a motion sensor that has improved edge placement (or other representation of rotational angle) in an output signal generated by the motion sensor. The motion sensor will provide directional information in the output signal once it is deemed to be accurate. The motion sensor will rapidly and accurately calibrate.

In accordance with one aspect of the present invention, a motion sensor includes a plurality of magnetic field sensing elements configured to generate a plurality of magnetic field signals indicative of a magnetic field associated with an object. The motion sensor also includes a respective plurality of state processors, each state processor coupled to receive a signal representative of a respective one of the plurality of magnetic field signals. Each one of the plurality of state processors is configured to generate a respective STATE_SM signal indicative of a plurality of states associated with a respective one of the plurality of magnetic field signals. Each one of the plurality of states is indicative of a respective range of signal values. The STATE_SM signal includes a plurality of first direction state transitions and a plurality of second direction state transitions, wherein the plurality of first direction state transitions and the plurality of second direction state transitions are capable of state transition chatter. Each one of the plurality of state processors includes a respective state peak logic module coupled to receive the respective STATE_SM signal and configured to generate a respective STATE_PEAK signal. The STATE_PEAK signal includes a plurality of first direction state peak transitions and a plurality of second direction state peak transitions, wherein the plurality of first direction state peak transitions and the plurality of second direction state peak transitions have reduced state transition chatter.

In accordance with another aspect of the present invention, a method of detecting a motion of an object includes generating a plurality of magnetic field signals indicative of a magnetic field associated with the object, and generating a STATE_SM signal indicative of a plurality of states associated with a respective one of the plurality of magnetic field signals. Each one of the plurality of states is indicative of a respective range of signal values. The STATE_SM signal includes a plurality of first direction state transitions and a plurality of second direction state transitions, wherein the plurality of first direction state transitions and the plurality of second direction state transitions are capable of state transition chatter. The method also includes generating a STATE_PEAK signal related to the STATE_SM signal. The STATE_PEAK signal includes a plurality of first direction state peak transitions and a plurality of second direction state peak transitions, wherein the plurality of first direction state peak transitions and the plurality of second direction state peak transitions have reduced state transition chatter.

In accordance with another aspect of the present invention, a computer-readable storage medium having computer readable code thereon for providing sensing of a motion of an object includes instructions for receiving a plurality of magnetic field signals indicative of a magnetic field associated with the object, and instructions for generating a STATE_SM signal indicative of a plurality of states associated with a respective one of the plurality of magnetic field signals. Each one of the plurality of states is indicative of a respective range of signal values. The STATE_SM signal includes a plurality of first direction state transitions and a plurality of second direction state transitions, wherein the plurality of first direction state transitions and the plurality of second direction state transitions are capable of state transition chatter. The computer-readable storage medium also includes instructions for generating a STATE_PEAK signal related to the STATE_SM signal. The STATE_PEAK signal includes a plurality of first direction state peak transitions and a plurality of second direction state peak transitions, wherein the plurality of first direction state peak transitions and the plurality of second direction state peak transitions have reduced state transition chatter.

With the above arrangements, a motion sensor can provide states that have a reduced amount of state chatter. Thus, the states can be more closely spaced than would otherwise be possible. The motion sensor can provide more accurate knowledge of a position of a moving object (e.g., rotational angle of a rotating object).

BRIEF DESCRIPTION OF THE DRAWINGS

The foregoing features of the invention, as well as the invention itself may be more fully understood from the following detailed description of the drawings, in which:

FIG. 7 a graph showing a DIFF signal (also representative of a digital DDIFF signal or a digital IDDIFF signal) and associated states of the motion sensor of FIG. 1;

FIG. 7A a graph showing POSCOMP and POSCOMP_PK signals derived from the DIFF signal of FIG. 7 by the motion sensor of FIG. 1;

FIG. 9 a graph showing a DIFF signal and associated states of the motion sensor of FIG. 1 when an inflection (change of direction) occurs;

FIG. 9A a graph showing POSCOMP and POSCOMP_PK signals and states derived from the DIFF signal of FIG. 10 by the motion sensor of FIG. 1;

DETAILED DESCRIPTION OF THE INVENTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hail elements, vertical Hall elements, circular Hall elements. As is also known, there are different types of magnetoresistance elements, for example, anisotropic magnetoresistance (AMR) elements, giant magnetoresistance (GMR) elements, tunneling magnetoresistance (TMR) elements, indium antimonids (InSb) elements, and magnetic tunnel junction (MTJ) elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, many, but not all, types of magnetoresistance elements tend to have axes of maximum sensitivity parallel to the substrate and many, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to a current sensor that senses a magnetic field generated by a current carried by a current-carrying conductor, a magnetic switch or proximity detector that senses the proximity of a ferromagnetic or magnetic object, a rotation detector (rotation sensor or motion sensor) that senses passing ferromagnetic articles, for example, magnetic domains of a ring magnet or teeth of a ferromagnetic gear, and a magnetic field sensor that senses a magnetic field density of a magnetic field. Rotation detectors are used as examples herein. However, the circuits and techniques described herein apply also to any magnetic field sensor capable of detecting a motion of an object, i.e., any motion sensor.

As used herein, the term "rotational vibration" refers to a back and forth rotation of an object about an axis of rotation, which object is adapted to rotate in a unidirectional manner about the axis of rotation in normal operation. As used herein, the term "translational vibration" refers to translation of the object and/or of magnetic field sensors used to detect magnetic fields generated by the object generally in a direction perpendicular to the axis of rotation, it should be recognized that both rotational vibration and translational vibration can cause signals to be generated by the magnetic field sensors.

Figure 1:
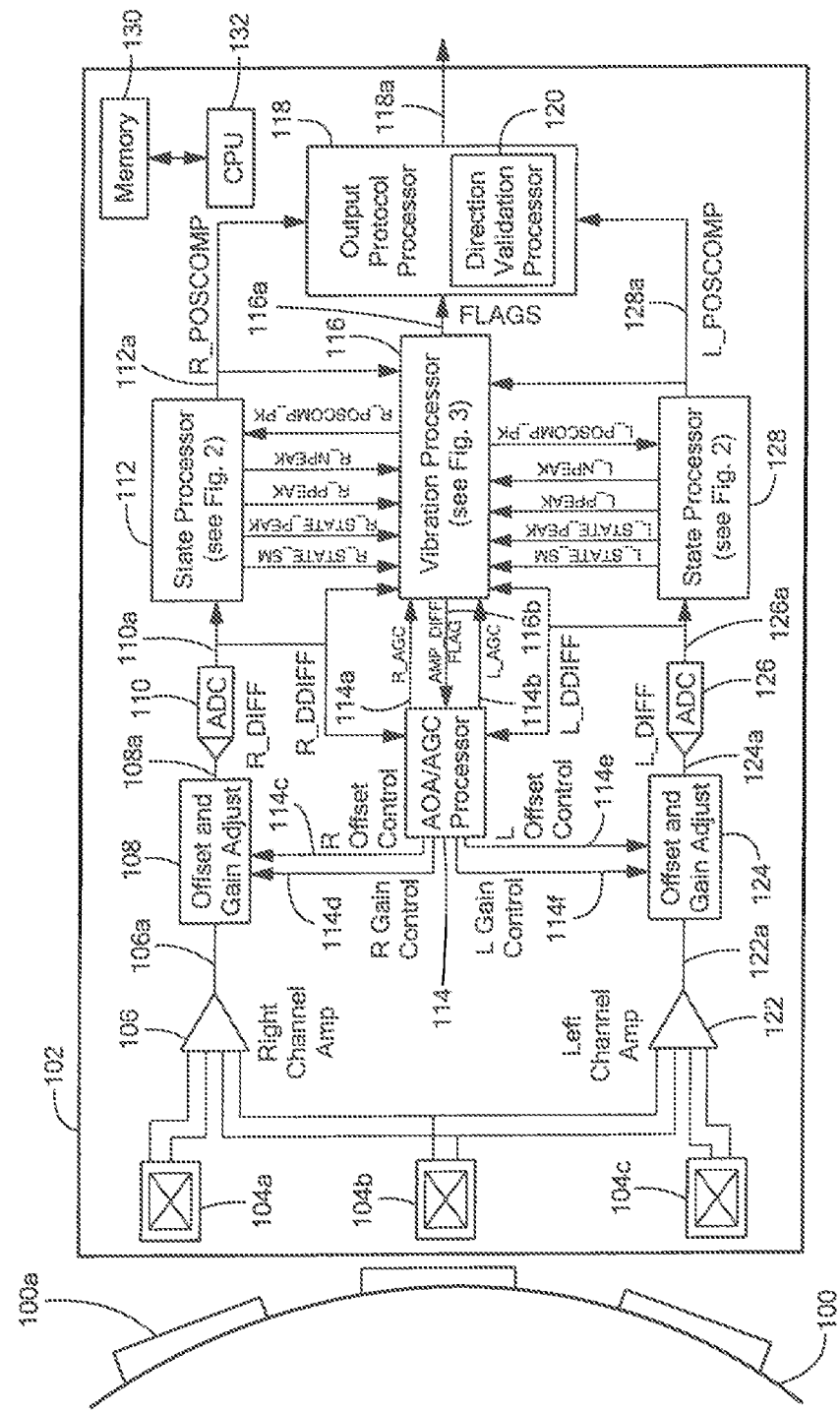
FIG. 1 is a block diagram showing a motion sensor having two state processors, a vibration processor, an automatic offset adjust (AOA) and automatic gain control (AGC) processor, two offset and gain adjust circuits, and an output protocol processor.

Referring to FIG. 1, an exemplary motion sensor 102 includes three magnetic field sensing elements 104a-104c, each configured to generate a respective magnetic-field-sensing-element signal in response to passing teeth of a rotating gear 100, in particular teeth of the rotating gear 100, of which a tooth 100a is but one example. The motion sensor 102 also includes a right channel amplifier 106 and a left channel amplifier 122. The terms "right" and "left" are arbitrary identifiers, which indicate different physical positions of the magnetic field sensing elements that contribute to a right channel and a left channel.

The motion sensor 102 can include offset and gain adjustment circuits 108, 124 that remove unwanted DC offsets and provide adjustable gains to signals 106a, 122a provided by the amplifiers 106, 122, respectively. The offset and gain adjustment circuits 108, 124 generate bin R_DIFF signal 108a and an L_DIFF signal 124a, respectively In some alternate embodiments, the motion sensor 102 includes only offset or only gain adjustment circuits.

The offset and gain adjustment circuits 108, 124 are not described in detail herein However, the offset and gain adjustment circuits 108, 124 can be of a type described in U.S. Pat. No. 7,138,793, issued Nov. 21, 2006, which is assigned to the assignee of the present invention.

The R_DIFF signal 108a and an L_DIFF signal 124a are referred to herein as magnetic field signals, responsive to magnetic fields sensed by the magnetic field sensing elements 104a-104c. The R_DIFF signal 108a is representative of a magnetic field experienced by the magnetic field sensing elements 104a, 104b and the L_DIFF signal 124a is representative of a magnetic field experienced by the magnetic field sensing elements 104b, 104c.

The motion sensor 102 can include an analog-to-digital converter (ADC) 110 coupled to receive the R. DIFF signal 108a and configured to generate a right channel digital DIFF signal, R_DDIFF, 110a. Another analog-to-digital converter (ADC) 126 is coupled to receive the L_DIFF signal 124a and configured to generate a left channel digital DIFF signal, L_DDIFF, 126a. The R_DDIFF signal 110a and the L_DDIFF signal 126a are also referred to herein as magnetic field signals.

The motion sensor 102 can include a first state processor 112 coupled to receive the R_DDIFF signal 110a and configured to generate a plurality of signals including a right channel state signal, R_STATE_SM, indicative of a plurality of states associated with the R_DDIFF signal 110a, where each state is indicative of a range of signal values into which the R_DDIFF signal 110a falls during a respective time period.

The first state processor 112 is also configured to generate an R_POSCOMP signal 112a. Which, from discussion below, will be understood to be a two state signal having state transitions according to predetermined states of the R_STATE_SM signal.

Similarly, the motion sensor 102 can include a second state processor 128 coupled to receive the L_DDIFF signal 126a and configured to generate a plurality of signals including a left channel state signal, L_STATE_SM, indicative of a plurality of states associated with the L_DDIFF signal 126a, where each state is indicative of a range of signal values into which the L_DDIFF signal 126a falls during a respective time period.

The second state processor 128 is also configured to generate an L_POSCOMP signal 128a, which, from discussion below, will also be understood to be a two state signal having state transitions according to predetermined states of the L_STATE_SM signal.

Signal states are described more fully in conjunction with FIGS. 2, 3, 7, and 8 below.

The state processors 112, 128 are also configured to generate an R_STATE_PEAK signal and an L_STATE_PEAK signal, respectively, which are further described below in conjunction with FIG. 17, and which are signals similar to the R_STATE_SM and L_STATE_SM signals, but with a reduced amount of undesirable chatter between states.

The state processors 112, 128 are also configured to generate an R_PPEAK signal and an L_PPEAK signal, respectively, which are further described below in conjunction with FIG. 2, and which are signals indicative of magnitudes of positive peaks of the R_DDIFF signal and the L_DDIFF signal, respectively.

The state processors 112, 128 are also configured to generate an R_NPEAK signal and an L_NPEAK signal, respectively, which are further described below in conjunction with FIG. 2, and which are signals indicative of magnitudes of negative peaks of the R_DDIFF signal and the L_DDIFF signal, respectively.

The state processors 112, 128 are also configured to generate an R_POSCOMP_PK signal and an L_POSCOMP_PK signal, respectively, which are further described below in conjunction with FIGS. 7A, 9A, and 10, and which are signals similar to the R_POSCOMP and L_POSCOMP signals 112a, 128a, but with different timing.

The motion sensor 102 can include a vibration processor 116 coupled to receive the R_POSCOMP signal 112a, the L_POSCOMP signal 128a, the R_STATE_SM signal, the L_STATE_SM signal, the R_STATE_PEAK signal, the L_STATE_PEAK signal, the R_PPEAK signal, the L_PPEAK signal, the R_NPEAK signal, the L_NPEAK signal, the R_POSCOMP_PK signal, and the L_POSCOMP_PK signal.

The vibration processor 116 is also coupled to receive an R_AGC signal 114a and a L_AGC signal 114b, representative of values of right and left channel automatic gain controls signals 114d, 114f, respectively. The vibration, processor 116 is configured to generate one or more FLAG signals (binary indicators) 116a and an amplitude difference flag signal (AMP_DIFF_FLAG signal) 116b, each of which can be indicative of a vibration of the object 100, or of no vibration of the object 100.

In some embodiments, the vibration processor 116 can include two or more vibration sub-processors described below in conjunction with FIG. 3, each of which can detect a vibration and each of which can contribute to the FLAG signals 116a, 116b. For example, each one can contribute one or more vibration bits, each indicative of a vibration. The vibration processor 116 is described more fully below in conjunction with FIGS. 3, 5-5B, and 9-16A.

The motion sensor 102 can also include an automatic offset adjusting (AOA) processor 114 together with an automatic gain control (AGC) processor 114, herein referred to together as an AOA/AGC processor 114. The AOA/AGC processor 114 is coupled to receive the R_DDIFF signal 110a, the L_DDIFF signal 126a, and the amplitude difference flag signal, AMP_DIFF_FLAG, 116b. The AOA/AGC, processor 114 is configured to generate right and left channel gain control signals 114d, 114f, respectively, and also right and left channel offset control signals 114c, 114e, respectively, to control gain and offset of the offset and gain adjust modules 108, 124. The AOA/AGC processor 114 is also configured to generate signals R_AGC and L_AGC 114a, 114b, respectively, which are signals representative of the gain control signals 114d, 114f, respectively. In some alternate embodiments, the AOA/AGC processor 114 is instead only an AOA processor or an AGC processor.

The motion sensor 102 can include an output protocol processor 118 coupled to receive the R_POSCOMP signal 112a, the L_POSCOMP signal 128a, and the FLAG signals 116a. The output protocol processor 118 is configured to generate a motion signal 118a indicative of a motion (rotation) of the gear 100 and also indicative of the vibration of one or more of the magnetic field sensing elements 104a-104c, and/or of the gear 102.

The output protocol processor 118 can include a direction validation processor 120 configured to process the R_POSCOMP signal 112a, the L_POSCOMP signal 128a, and the FLAG signal 116a to generate the motion signal 118a.

In some embodiments, the motion signal 118a is a single bit digital signal having a frequency related to the speed of rotation of the gear 100, and a selected one of two pulse widths indicative of a direction of rotation of the gear 100. In some embodiments, the motion signal 118a is blanked (i.e., is inactive) when the FLAG signal 116a is indicative of a vibration. In some embodiments, upon a first power up of the motion sensor 102, the motions signal 118a is blanked (or otherwise does not indicate a direction of rotations) up until a valid time, after which it become active. Identification of the valid time is described below in conjunction with FIGS. 18, 18A, and 19-19B. However, in other embodiments, the motion signal 118a can indicate aspects of the rotation of the gear 100 in other ways, and the above-described vibration can be represented in other ways.

Exemplary output signals with different protocols are described in U.S. patent application Ser. No. 12/183,367, filed Jul. 31, 2008, in U.S. Pat. No. 6,815,944, issued Nov. 9, 2004, and in U.S. Pat. No. 7,026,808, issued Apr. 11, 2006.

In some embodiments, the motion sensor 102 is comprised of a custom electronic device having electronic components, for example, gates, configured to implement the various processors and modules described above and the various processes described below. In some other embodiments, the motion sensor 102 has a structure comprised of a central processing unit 132 and a memory 130 (a computer-readable storage medium), for example, a program memory, configured to implement the various processors and modules described above and the various processes described below.

Figure 2:
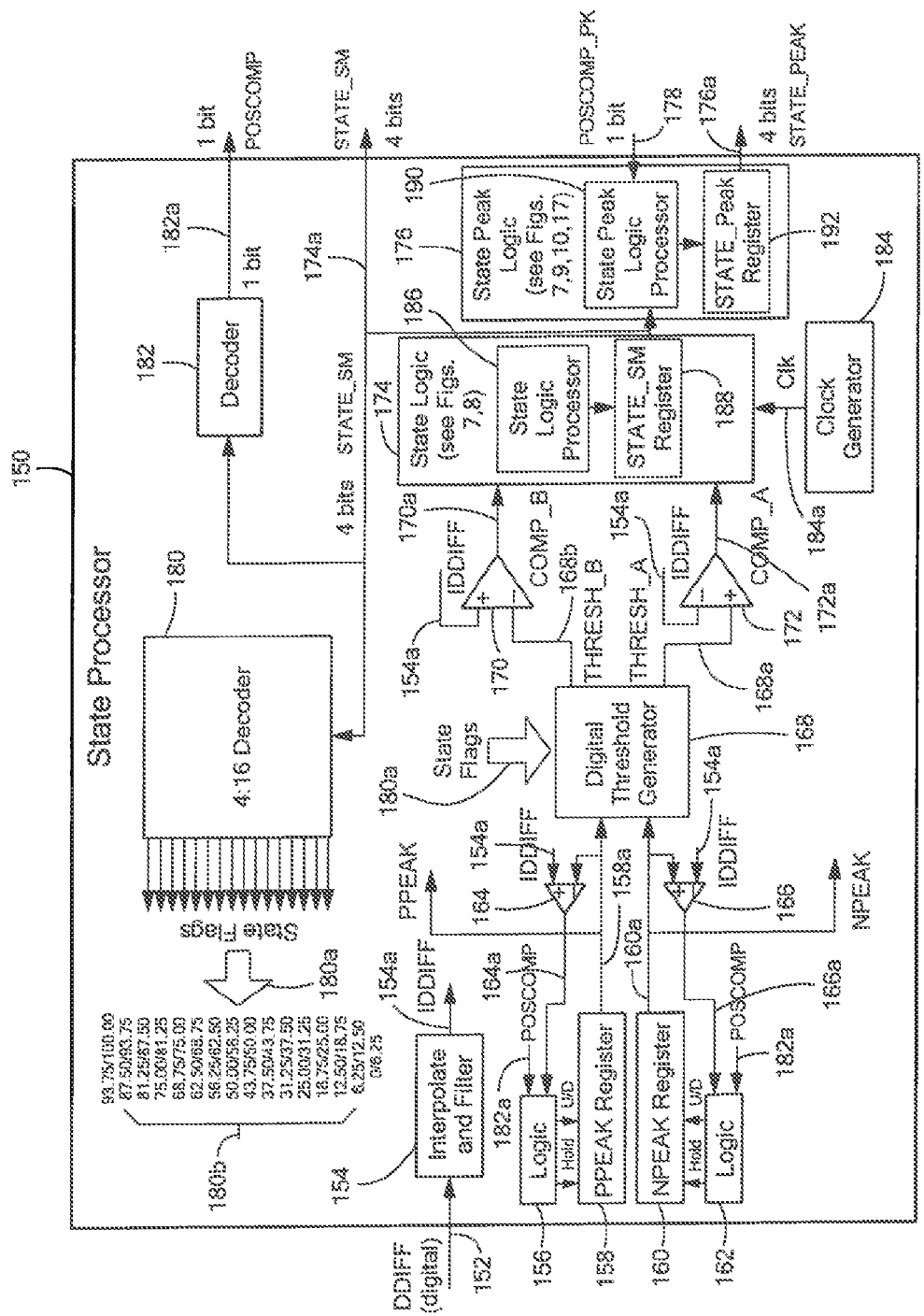
FIG. 2, is a block diagram showing further details of one of the two state processors of FIG. 1, including a state logic module and a state peak logic module.

Referring now to FIG. 2, a state processor 150 can be the same as or similar to each one of the state processors 112, 128 of FIG. 1, but is show here for only one of the left or the right channels of FIG. 1. The state processor 150 is coupled to receive a DDIFF signal 152, which can be the same as or similar to the R_DDIFF signal 110a or the L_DDIFF signal 126a of FIG. 1. In FIG. 2, the right and left channel designations (R and L) are omitted since the state processor 150 can be the same in the right and left channels.

In some embodiments, the state processor 150 can include an interpolation and filtering module 154 coupled to receive the DDIFF signal 152 and configured to generate an interpolated digital DIFF signal (IDDIFF) 154a. The interpolation and filtering can be performed in a variety of ways to result in the IDDIFF signal 154a having a higher resolution and sampling rate than the DDIFF signal 152. In some embodiments, the DDIFF signal 152 has a sample rate of about three hundred thousand samples per second, and each sample is a nine-bit word. In some embodiments, the IDDIFF signal 154a has a sample rate of about 2.7 million samples per second (nine times the DDIFF rate), and each sample is a nine-bit word.

In some embodiments the interpolation and filter module 154 performs a six stage cascaded integrator comb (CIC) (a second order CIC) interpolating filter, with stages $1-z^{-9}$, $1-z^{-9}$, x9, $1/(1-z^{-1})$, $1/(1-z^{-1})$, and $1/81$, for a transfer function of:

$$[1-2z^{-9}+z^{-18}]/[81(1-2z^{-1}+z^{-2})]$$

Other types of interpolation and filter modules can also be used, for example, a linear interpolation filter, a quadratic interpolation filter, or an exponential interpolation filter.

The state processor 150 includes a PPEAK register 158 (which, in some embodiments, can be a counter), which can hold or count up or count down, under the control of a first logic circuit 156. The first logic circuit 156 is responsive to a POSCOMP signal 182a (which can be the same as or similar to the R_POSCOMP signal 112a or the L_POSCOMP signal 128a of FIG. 1) and to a comparator output signal 164a generated by a comparator 164. The PPEAK register 158 holds values that contribute to a PPEAK signal 158a that tracks positive peaks of the IDDIFF signal 154a.

Similarly, the state processor 150 includes an NPEAK register 160 (which, in some embodiments, can be a counter), which can hold or count up or count down, under the control of a second logic circuit 162. The second logic circuit 162 is responsive to the POSCOMP signal 182a and to a comparator output signal 166a generated by a comparator 166. The NPEAK register 160 holds values that contribute to an NPEAK signal 160a that tracks negative peaks of the IDDIFF signal 154a. Comparators 164, 166 are digital comparators coupled to receive digital signals and configured to generate digital output signals.

Generation of the PPEAK signal 158a and the NPEAK signal 160a is further described below in conjunction with FIG. 7. However, let it suffice here to say that the PPEAK signal 158a and the NPEAK signal 160a are generally DC digital signals, wherein a difference between the PPEAK signal 158a and the NPEAK signal 160a is representative of a peak-to-peak amplitude of the MIFF signal 154a.

The state processor 150 can also include a digital threshold generator 168 coupled to receive the PPEAK signal 158a and the NPEAK signal 160a. Under control of a STATE FLAGS signal 180a, the digital threshold generator 168 is configured to generate selected threshold signals 168a, 168b that are at determined percentages of the peak-to-peak amplitude of the IDDIFF signal 154a. For example, for one time period, the threshold signals 168a, 168b can be near 31.25% and 37.50%, respectively, of the peak-to-peak amplitude of the IDDIFF signal 154a.

The two threshold signals 168a, 168b (also referred to a THRESH_A and THRESH_B) are received by comparators 172,170, respectively, which are digital comparators. The comparators 170, 172 are also coupled to receive the IDDIFF signal 154a. The comparator 170 is configured to generate a COMP_B comparison signal 170a and the comparator 172 is configured to generate a COMP_A comparison signal 172a. It will be recognized that the comparators 170, 172 operate as a window comparator, and from the signals 170a, 172a, it can be deduced if the IDDIFF signal 154a is between the thresholds THRESH_A 168a and THRESH_B 168b.

The THRESH_A and THRESH_B signals 168a, 168b represent a pair of digital values selected to be one of sixteen pairs of values 180b. Therefore, at any instant in time, the comparators 170, 172 are able to identify in which of the sixteen ranges of values 180b the IDDIFF signal 154a resides. The ranges 180b are also referred to herein as states of the IDDIFF signal 154a (or states of the corresponding DIFF or DDIFF signals).

The state processor 150 can also include a state logic module 174 coupled to receive the COMP_A and COMP_B signals, 172a, 170a, respectively. The state logic module 174 is described more fully below in conjunction with FIGS. 7 and 8. However, let it suffice here to say that the state logic module 174 decodes the state information associated with the COMP_A and COMP_B signals 172a, 170a described above and provides a 4-bit STATE_SM signal 174a. The STATE_SM signal 174a is indicative of states, i.e., ranges, through which the IDDIFF signal 154a progresses.

The state logic module 174 can include a state logic processor 186 coupled to a STATE_SM register 188, which is configured to hold values (e.g., one value at a time, progressively) of the STATE_SM signal 174a.

The state processor 150 can also include a state peak logic module 176 coupled to receive the STATE_SM signal 174a and a POSCOMP_PK signal 178 describe more fully below in conjunction with FIGS. 7, 7A, 9, 9A, and 10. The state peak logic module 176 is configured to generate a STATE_PEAK signal 176a, which is similar to the STATE_SM signal 174a, but which has transitions with fewer transition errors (chatter). The transition errors are described more fully below in conjunction with FIGS. 7 and 7A.

The state peak logic module 176 can include a state peak logic processor 190 coupled to a STATE_PEAK register 192, which is configured to hold values of the STATE_PEAK signal 176a.

The state processor 150 can also include a 4:16 decoder 180 coupled to receive the STATE_SM signal 174a. The 4:16 decoder 180 is configured to provide one of sixteen control signals, i.e., STATE_FLAGS 180a, as shown. Each one of the flags is indicative of a particular amplitude range from among a plurality of amplitude ranges 180b. The amplitude ranges 180b are expressed as percentages of a peak-to-peak range of the IDDIFF signal 154a.

While particular amplitude ranges 180b are shown, it will be understood that the amplitude ranges can be different than those shown, and need not be linearly configured.

The state processor 150 can also include a decoder 182 coupled to receive the STATE_SM signal 174a and configured to generate the POSCOMP signal 182a having transitions at times of particular ones of the states transitions within the STATE_SM signal 174a.

The state processor 150 can also include a clock generator circuit 184 that provides a clock signal, CLK, 184a to clock the state logic module and other processors and modules within the state processor 150.

Figure 3:
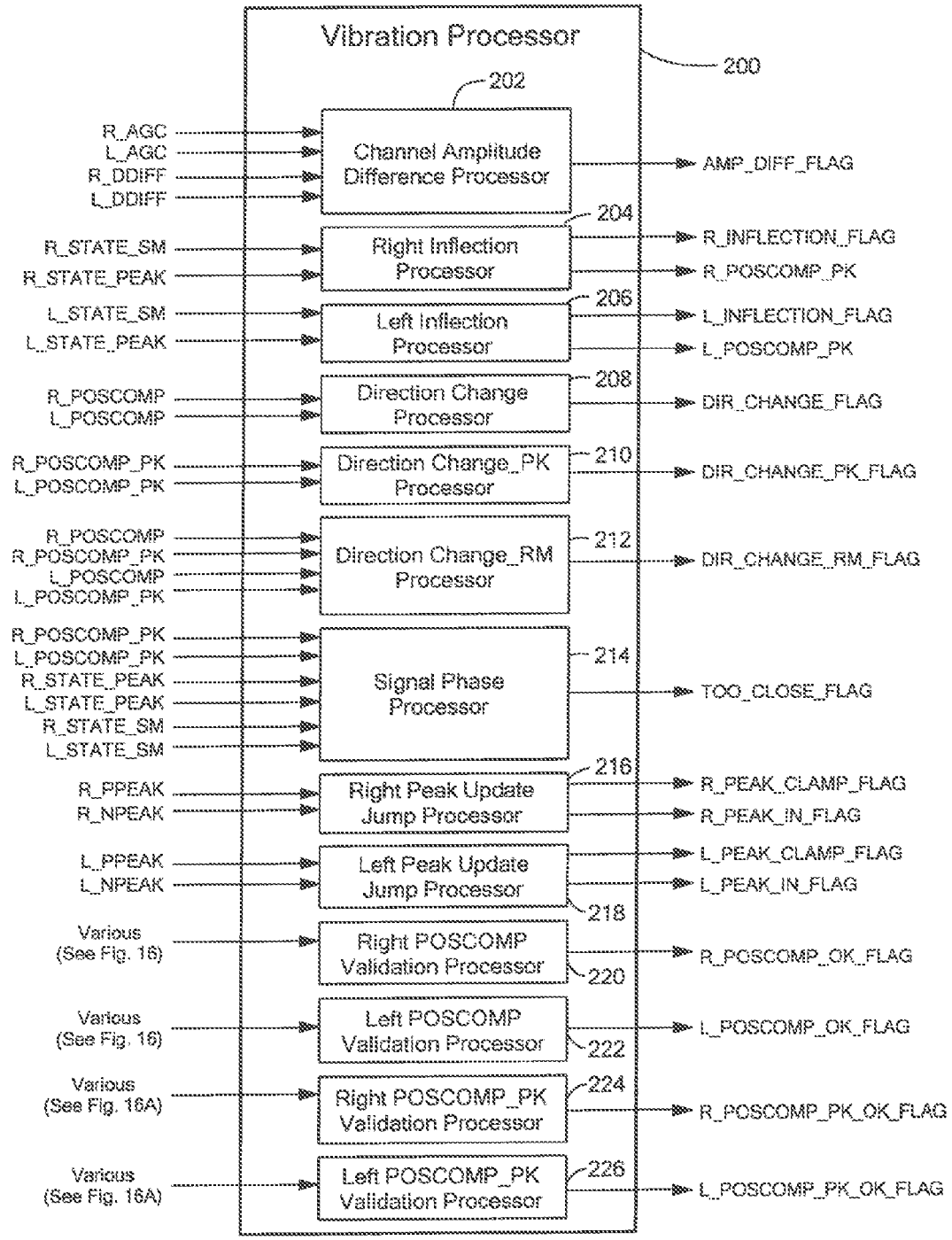
FIG. 3 is a block diagram showing portions of the vibration processor of FIG. 1, including a channel amplitude difference processor, right and left channel inflection processors, a direction change processor, a direction change_PK processor, a direction change_RM processor, a signal phase processor, right and left channel update jump processors, right and left channel POSCOMP validation processors, and right and left channel POSCOMP_PK validation processors.

Referring now to FIG. 3, a vibration processor 200 can be the same as or similar to the vibration processor 114 of FIG. 1. The vibration processor 200 is coupled to receive many signals from the right and left channels of the motion sensor 102 of FIG. 1, as described above in conjunction with FIG. 1. The vibration processor 200 is configured to process the various input signals and to generate a plurality of flag signals, which can be single bit two-state signals.

In particular, the vibration processor 200 can include a channel amplitude difference processor 202 configured to receive the signals R_AGC and L_AGC representative of the right and left gain control signals 114d, 114f of FIG. 1, and also coupled to receive the R_DDIFF signal 110a and the L_DDIFF signal 126a of FIG. 1. The channel amplitude difference processor 202 is configured to generate an AMP_DIFF_FLAG signal representative of the right and left gain control signals 114d, 114f differing by more than a predetermined amount, which tend to be representative of a vibration the object 100 of FIG. 1. Operation of the channel amplitude difference processor 202 is described more fully below in conjunction with FIGS. 5-5.

The vibration processor 200 can also include right and left inflection processors 204, 206, respectively. The right inflection processor 204 is coupled to receive the R_STATE_SM signal of FIG. 1 (sec also the STATE_SM signal 174a, of FIG. 2) and the R_STATE_PEAK signal of FIG. 1 (see also the STATE_PEAK signal 176a of FIG. 2). The right inflection processor 204 is configured to generate a R_INFLECTION_FLAG signal indicative of a change of direction of the object 100 of FIG. 1 and also to generate the R_POSCOMP_PE signal of FIG. 1 (see also the POSCOMP_PK signal 178 of FIG. 2).

The left inflection processor 206 is coupled to receive the L_STATE_SM signal of FIG. 1 (see also the STATE_SM signal 174a of FIG. 2) and the L_STATE_PEAK signal of FIG. 1 (see also the STATE_PEAK signal 176a of FIG. 2). The left inflection processor 206 is configured to generate a L_INFLECTION_FLAG signal indicative of a change of direction of the object 100 of FIG. 1 and also to generate the L_POSCOMP_PK signal of FIG. 1 (see also the POSCOMP_PK signal 178 of FIG. 2).

Generation of the R_POSCOMP_PK signal and the L_POSCOMP_PK signal is described more fully below in conjunction with FIGS. 7, 7A, and 10. Operation of the inflection processors 204, 206 is further described below in conjunction with FIGS. 9, 9A, and 10.

The vibration processor 200 can also include a direction change processor 208 coupled to receive the R_POSCOMP signal 112a and the L_POSCOMP signal 128a of FIG. 1 (see also the POSCOMP signal 182a of FIG. 2). The direction change processor 208 is configured to generate a DIR_CHANGE_FLAG signal indicative of a change of direction of the object 100 of FIG. 1. Operation of the direction change processor 208 is further described below in conjunction with FIG. 11.

The vibration processor 200 can also include a direction change_PK processor 210 coupled to receive the R_POSCOMP_PK signal and the L_POSCOMP_PK signal of FIG. 1 (see also the POSCOMP_PK signal 178 of FIG. 2 and the R_POSCOMP_PK signal generated by the right inflection processor 204 and the L_POSCOMP_PK signal generated by the left inflection processor 206 of FIG. 3). The direction change_PK processor 210 is configured to generate a DIR_CHANGE_PK_FLAG signal indicative of a change of direction of the object 100 of FIG. 1. Operation of the direction change_PK processor 210 is further described below in conjunction with FIG. 12.

The vibration processor 200 can also include a direction change_RM (running mode) processor 212 coupled to receive the R_POSCOMP signal, the L_POSCOMP signal, the R_POSCOMP_PK signal, and the L_POSCOMP_PK signal. The direction change_RM processor 212 is configured to generate a DIR_CHANGE_RM_FLAG signal indicative of a change of direction of the object 100 of FIG. 1. Operation of the direction change_RM processor 212 is further described below in conjunction with FIG. 13.

The vibration processor 200 can also include a signal phase processor 214 coupled to receive the R_POSCOMP_PK signal, the L_POSCOMP_PK signal, the R_STATE_PK signal, the L_STATE_PK signal, the R_STATE_SM signal, and the L_STATE_SM signal of FIG. 1 (see also the STATE_PEAK signal 176a and the STATE_SM signal 174a of FIG. 2). The signal phase processor 214 is configured to generate a TOO_CLOSE_FLAG signal indicative of signals in the right and left channels being too close in phase and therefore, a vibration of the object 100 of FIG. 1. Operation of the signal phase processor 214 is further described below in conjunction with FIG. 14.

The vibration processor 200 can also include right and left peak update jump processors 216, 218, respectively. The right peak update jump processor 216 is coupled to receive the R_PPEAK signal and the R_NPEAK signal of FIG. 1 (see also the PPEAK and NPEAK signals 158a, 160a, respectively, of FIG. 2). The left peak update jump processor 218 is coupled to receive the L_PPEAK signal and the L_NPEAK signal of FIG. 1 (see also the PPEAK and NPEAK signals 158a, 160a, respectfully, of FIG. 2). The right peak update jump processor 216 is configured to generate an R_PEAK_CLAMP_FLAG signal indicative of a right channel magnetic field signal increasing being too large in amplitude and an R_PEAK_IN_FLAG signal indicative of the right channel magnetic field signal being too small in amplitude. The left peak update jump processor 218 is configured to generate an L_PEAK_CLAMP_FLAG signal indicative of a left channel magnetic field signal being too large in amplitude and an L_PEAK_IN_FLAG signal indicative of the left channel magnetic field signal being too small in amplitude. Operation of the peak update jump processors 216, 218 is further described below in conjunction with FIG. 15.

The vibration processor 200 can also include right and left POSCOMP validation processors 220, 222, respectively. The right and left POSCOMP validation processors 220, 222 are coupled to receive various input signals as will become apparent from the discussion below in conjunction with FIG. 16. The right POSCOMP validation processor 220 is configured to generate an R_POSCOMP_OK_FLAG signal indicative of a proper R_POSCOMP signal. The left POSCOMP validation processor 222 is configured to generate an L_POSCOMP_OK_FLAG signal indicative of a proper L_POSCOMP signal. Operation of the POSCOMP validation processors 220, 222 is further described below in conjunction with FIG. 16.

The vibration processor 200 can also include right and left POSCOMP_PK validation processors 224, 226, respectively. The right and left POSCOMP_PK validation processors 224, 226 are coupled to receive various input signals as will become apparent from the discussion below in conjunction with FIG. 16A. The right POSCOMP_PK validation processor 224 is configured to generate an R_POSCOMP_PK_OK_FLAG signal indicative of a proper R_POSCOMP_PK signal. The left POSCOMP_PK validation processor 226 is configured to generate an L_POSCOMP_PK_OK_FLAG signal indicative of a proper L_POSCOMP_PK signal. Operation of the POSCOMP_PK validation processors 224, 226 is further described below in conjunction with FIG. 16A.

It should be appreciated that FIGS. 4, 5, 6, 10-17, and 19 show flowcharts corresponding to the below contemplated technique which would be implemented in the motion sensor 102 of FIG. 1. Rectangular elements (typified by element 256 in FIG. 4), herein denoted "processing blocks," represent computer software instructions or groups of instructions. Diamond shaped elements (typified by element 260 in FIG. 4), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown, ft will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Figure 4:
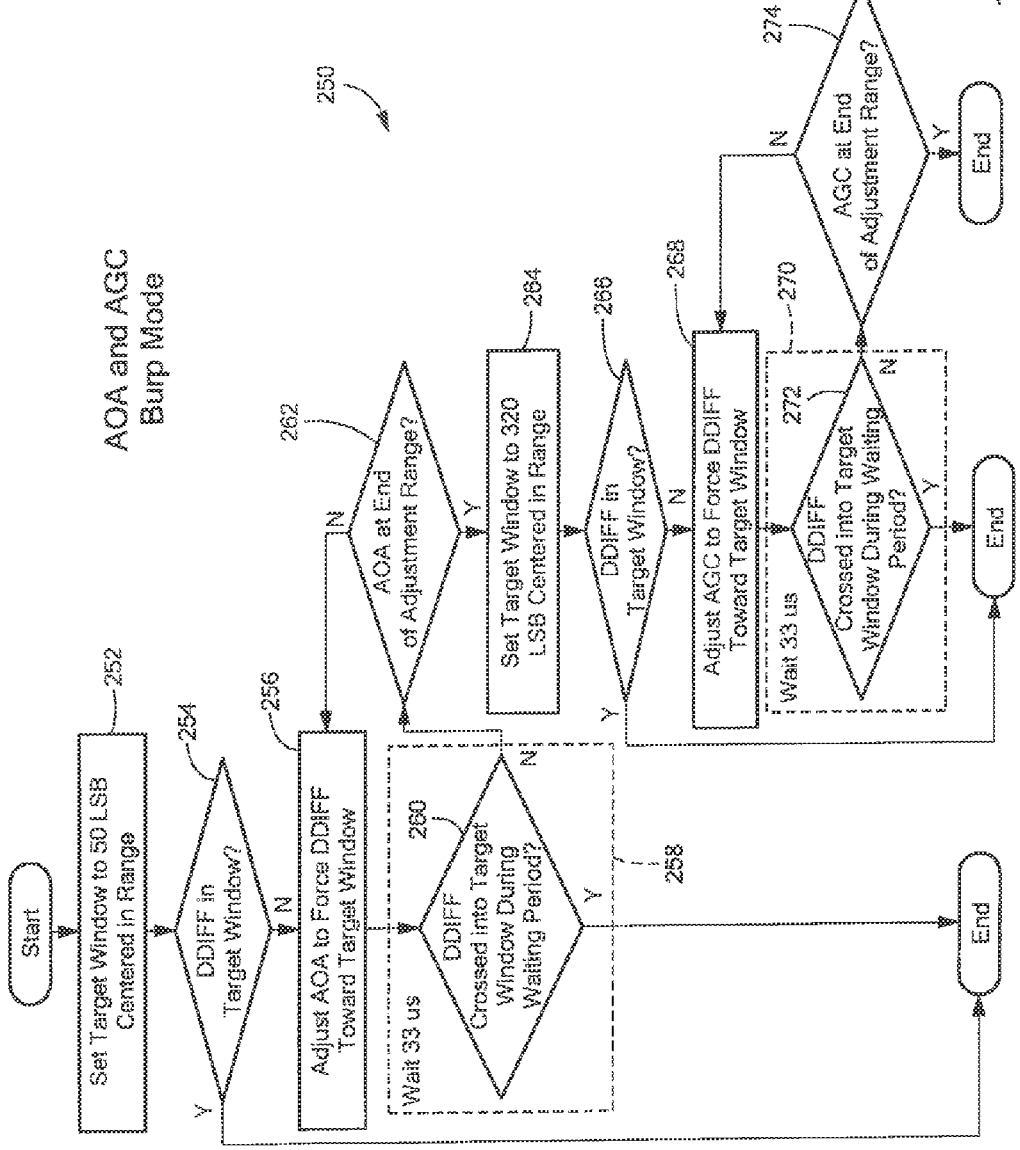
FIG. 4 is a flow chart showing a process for operation of the AOA/AGC processor of FIG. 1 in a BURP mode of operation.
Figure 5:
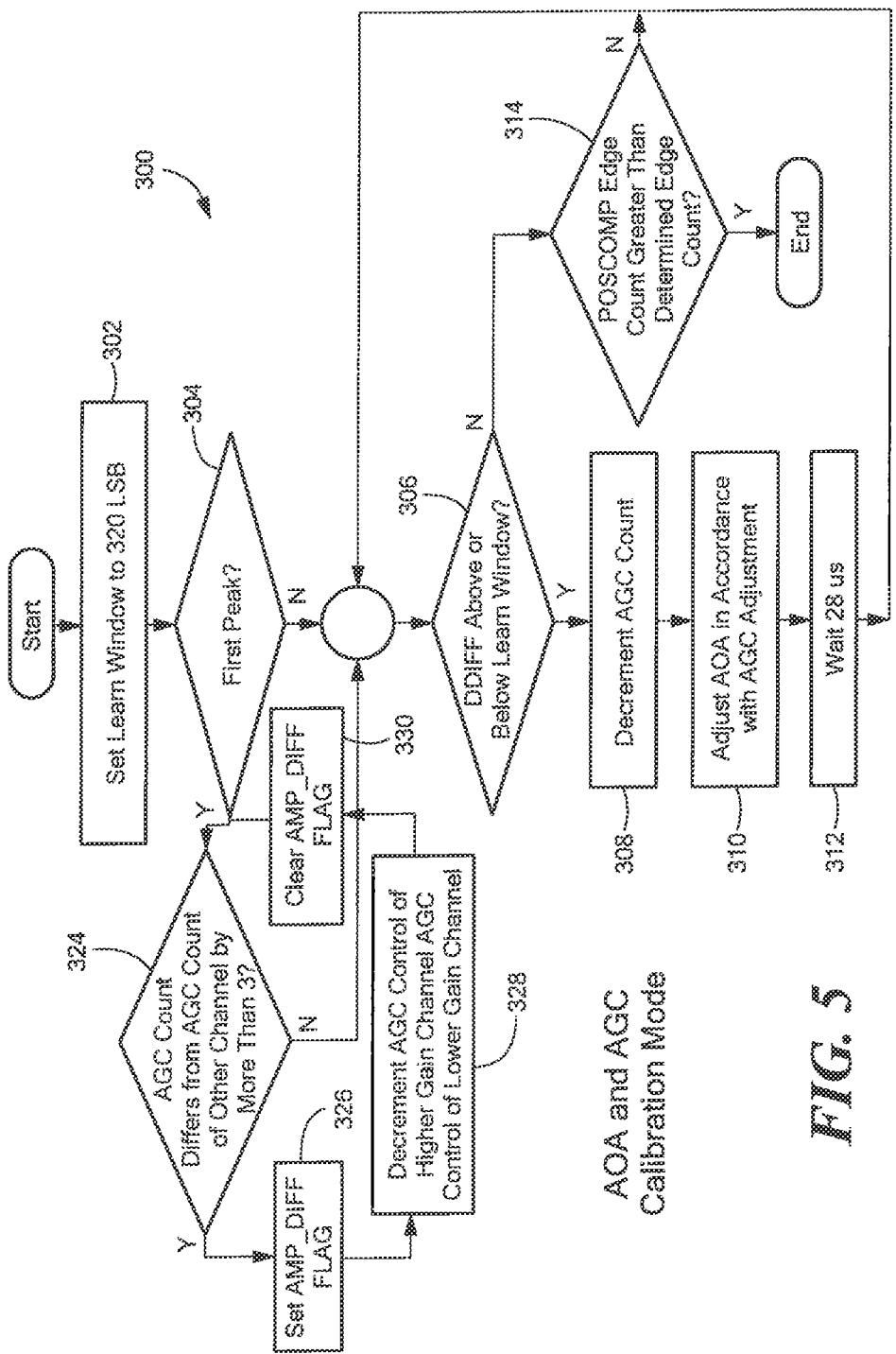
FIG. 5 is a flow chart showing a process for operation of the AOA/AGC processor of FIG. 1 in a calibration mode of operation, including operation of the channel amplitude difference processor of FIG. 3.
Figure 6:
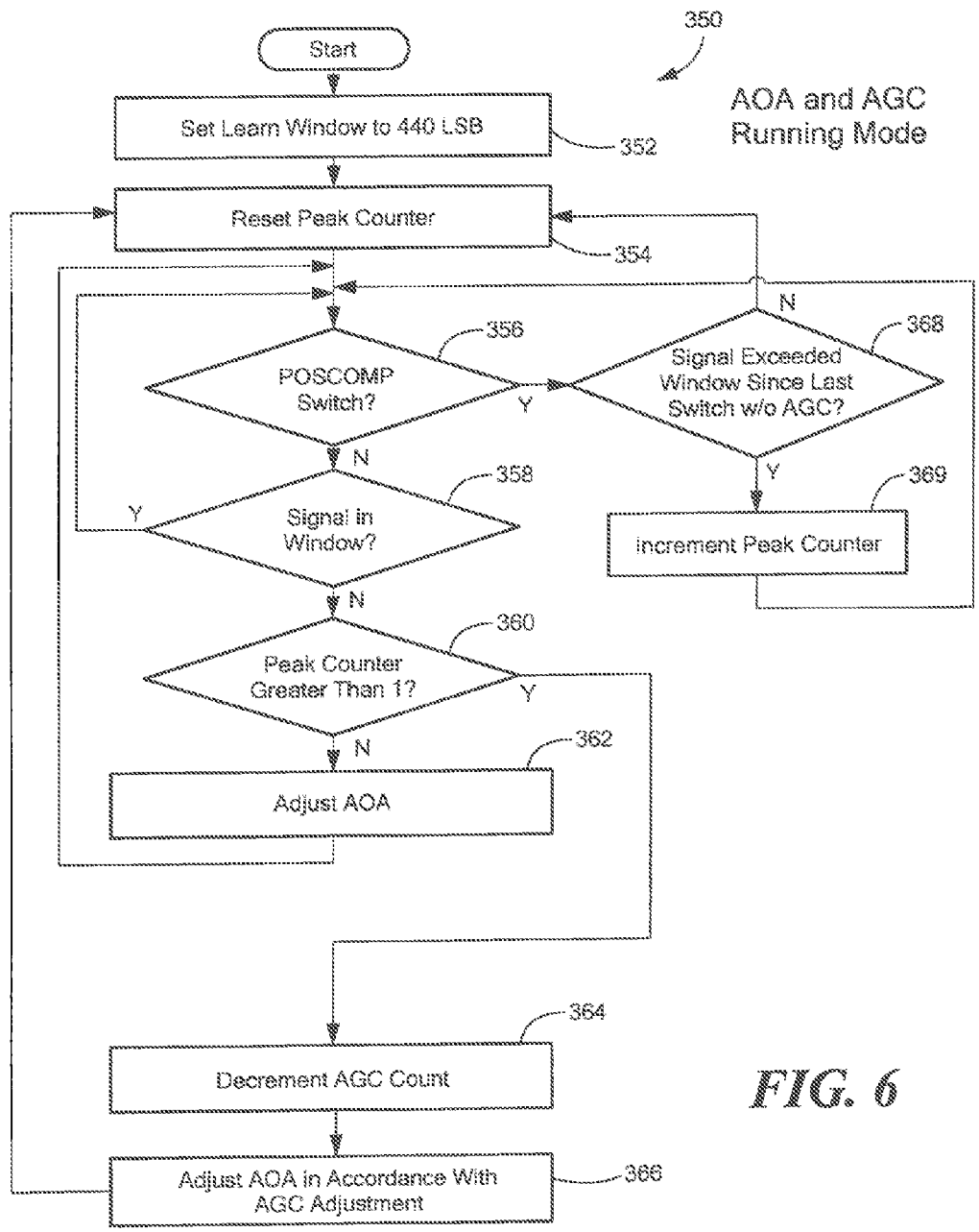
FIG. 6 is a flow chart showing a process for operation of the AOA/AGC processor of FIG. 1 in a running mode of operation.

FIGS. 4, 5, and 6 show processes associated with the AOA/AGC processor 114, the vibration processor 116, and the offset and gain adjust modules 108, 124 of FIG. 1.

Referring now to FIG. 4, a process 250 can begin shortly after power is first applied to the motion sensor 102 of FIG. 1, and is referred to herein as a BURP mode of operation. The process 250 refers to but one of the right or left channels. It should be understood that the process 250 can be applied to both the right and left channels either in series or in parallel.

The process 250 begins at block 252, where a target window is established. In one particular embodiment, a target window of about 50 least significant bits (LSBs) is selected, which is centered near the middle of an operating range of values that the DDIFF signal can take on (R_DDIFF signal 110a and/or L_DDIFF signal 126a of FIG. 1). In one particular embodiment, the DDIFF signal has nine bits, and thus the total range of the DDIFF signal is 511 least significant bits. During the BURP mode of operation, it is desired that the respective DDIFF signal be moved by operation of the AOA/AGC processor 114 (FIG. 1) and offset and gain adjust modules 108, 124 (FIG. 1) to be within the target window near the center of the operating range.

If the DDIFF signal is not within the target window, then at block 256, the AOA (i.e., the offset of the DIFF signal) is adjusted by operation of the AOA processor 114 of FIG. 1. In some embodiments, at block 256, one or both of the offset control signals 114c, 114e of FIG. 1 are adjusted by a number of counts that can depends on how far DDIFF signal is from the target window, for example, one count, to force the DDIFF signal toward the target window.

At block 260, which occurs during a waiting period 258 of approximately 33 microseconds, the DDIFF signal is inspected to identify if the DDIFF signal, at any time during the waiting period, crosses into the target window. If the DDIFF signal crosses into the target window at any time during the waiting period 258, the process 250 ends.

If at block 260, the DDIFF signal does not cross into the target window during the waiting period 258, then the process proceeds to block 262, where it is identified if the AOA (automatic offset adjustment) is at the end of its adjustment range. If the AOA is not at the end of its adjustment range, the process returns to block 256.

If at block 262, the AOA is at the end of its adjustment range, then to process proceeds instead to block 264.

At block 264, the target window is widened to about 320 least significant bits centered near the middle of the operating range of values that the DDIFF signal.

At block 266 it is determined if the DDIFF signal is within the new target window. If the DDIFF signal is within the new target window, the process ends. If the DDIFF signal is not within the new target window, the process proceeds to block 268 at which the AGC, rather than the AOA, is adjusted to more the DDIFF signal toward the new target window. In some embodiments, at block 268, one or both of the gain control signals 114d, 114f of FIG. 1 are adjusted by a number of counts that can depends on how far MIFF signal is from the target window, for example, one count, to force the DDIFF signal toward the new target window.

At block 272, which occurs during a waiting period 270 of about 33 microseconds, the DDIFF signal is inspected to identify if the DDIFF signal, at any time during the waiting period 270, crosses into the new target window. If the DDIFF signal crosses into the new target window at any time during the waiting period 270, the process 250 ends.

If at block 272, the DDIFF signal does not cross into the target window during the waiting period 270, then the process proceeds to block 274, where it is identified if the AGC is at the end of its adjustment range. If the AGC is not at the end of its adjustment range, the process 250 returns to block 268. At block 274, if the AGC is at the end of its adjustment range, then the process 250 ends.

Referring now to FIG. 5, after the BURP mode of operation described above in conjunction with FIG. 4, the AGC and AOA enter a calibration mode and a corresponding process 300. The process 300 begins at block 302, where a learn window of about 320 least significant bits is selected. The learn window is centered in the full range of the DDIFF which, in some embodiments, has 9 bits for a 511 least significant bit range.

The process 300 proceeds to block 304, where it is determined if the DDIFF signal has yet achieved a first signal peak following the BURP mode of FIG. 4. The first peak can be identified in a variety of ways. In one particular embodiment, the first peak is identified at a time before the DDIFF signal has crossed both the upper limit of the learn window and the lower limit of the learn window.

Essentially, at block 304, only once the DDIFF signal has crossed both the positive and negative limits has the DDIFF signal had both positive and negative excursions beyond the learn window requiring gain adjustment to bring the DDIFF signal in range. Using these criteria, gain adjustment does not take place on the first signal peak.

If the DDIFF signal is still within the first peak following the BURP mode of FIG. 4, then the process proceeds to block 324, where it is determined if the AGC counts of the gain control signals 114d, 114f of the right and left channels of Hal differ by more than three. If the AGC counts differ by more than three, then the process proceeds to block 326, where the AMP_DIFF_FLAG signal of FIGS. 1 and 3 is set.

At block 328, the AGC count of the higher gain channel is decremented toward the AGC count of the lower gain channel. Reasons for this adjustment will become more apparent from the discussion below in conjunction with FIGS. 5A and 5B. In some embodiments, at block 328, the AGC count of the higher gain channel is decremented to equal the AGC count of the lower gain channel. In other embodiments, the AGC count of the higher gain channel is decremented to be within a predetermined count, e.g., three, of the lower gain channel.

At block 330, the AMP_DIFF_FLAG signal is cleared.

If, at block 324, the AGC counts of the two channels do not differ by more than three, the process proceeds to block 306. If, at block 304, the DDIFF signal is after its first peak, then the process 300 also proceeds to block 306.

Remaining blocks discuss only the right or the left channel, but, as described above, the logic can be applied to both channels in parallel or in series.

At block 306, if the DDIFF signal is above an upper limit of the learn window or below a lower limit of the learn window, then the DDIFF signal is too large (gain too high) and the process proceeds to block 308, where the AGC count (e.g., of the respective gain control signal 114d or 114f of FIG. 1) is decremented.

At block 310, the AOA, i.e., the offset control signal (e.g., of the respective offset control signal 114c or 114e of FIG. 1) can be adjusted by an amount in accordance with the AGC adjustment of block 308.

The AOA step size in volts of the DDIFF signal is a function of the AGC gain. Signal normalization can be made consistent by, on the occurrence of an AGC adjustment, using the AOA to move the DDIFF signal by a voltage similar to that caused by the AGC adjustment. Using both the expected voltage step size of AOA at a given AGC gain and the expected voltage movement due to a given AGC adjustment, a table can be pre-calculated regarding what amount by which to adjust the AOA count for each possible AGC adjustment. The implementation can be a lookup table.

At block 312, the process 300 waits for about 28 milliseconds, and then returns to block 306.

If, at block 306, the DDIFF signal is not above the upper limit of the learn window or below the lower limit of the learn window, the process proceeds to block 314, where it is determined if a determined number of edges of the POSCOMP signal 182a of FIG. 2 have been detected. The determined number is a dynamically determined number that depends upon whether any vibrations have been detected. The determined number will be better understood from discussion blow in conjunction with FIGS. 19-19B. Let it suffice here to say that, in one embodiment, the determined number is three or more edges of the POSCOMP signal.

If the determined number of POSCOMP edges has occurred, then the process ends. If, the determined number of edges has not occurred, then the process returns to block 306, and further AGC and AOA adjustments can be made.

It will be apparent that at least blocks 324-330 can be carried out by the channel amplitude difference processor 202 of FIG. 3. However, other partitioning of functions is also possible.

Figure 5A:
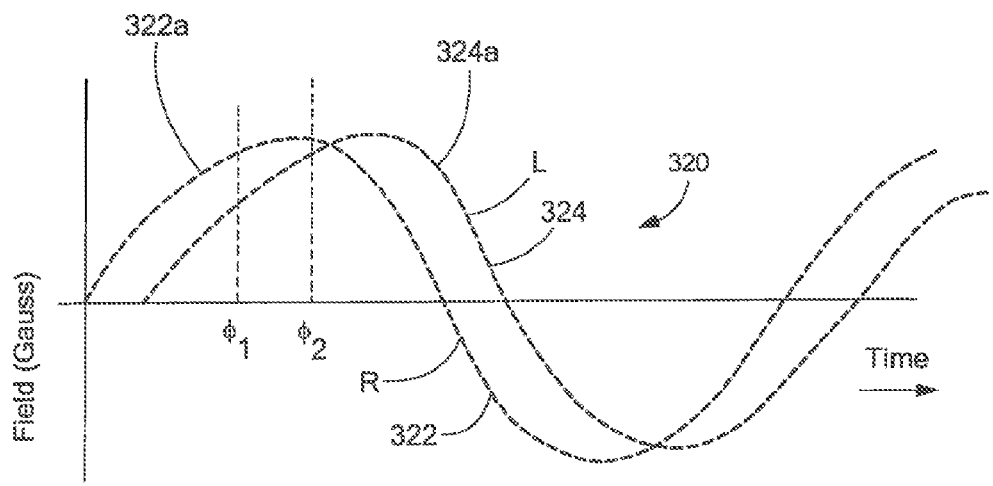
FIGS. 5A and 5B are graphs showing signal waveforms of the motion sensor of FIG. 1 associated with a vibration and associated with the amplitude difference processor of FIG. 3 and the process of FIG. 5.

Referring now to FIG. 5A, a graph 320 has a vertical axis in units of magnetic field strength in Gauss and a horizontal scale in arbitrary units of time. The graph 320 includes two signals. A first signal 322 is representative of a first magnetic field experienced, for example, by the magnetic field sensing elements 104a, 104b that contribute to the right channel of the motion sensor 102 of FIG. 1. second magnetic field signal 324 is representative of a second magnetic field experienced, for example, by the magnetic field sensing elements 104b, 104c that contribute to the left channel of the motion sensor 102 of FIG. 1.

The first signal 322 includes a portion 322a that exists between angles of rotation of the gear 100 of FIG. 1 between angles $\Phi_1$ and $\Phi_2$. The second signal 324 includes a portion 324a that exists between angles of rotation of the gear 100 of FIG. 1 between the angles $\Phi_1$ and $\Phi_2$. It will be appreciated that if the gear 100 of FIG. 1 experiences a rotational vibration, the rotational vibration can correspond to a back and forth rotation between the angles $\Phi_1$ and $\Phi_2$. Thus, other portions of the signal 322, 324 do not actually occur, but, regardless, are shown in phantom lines for clarity, as if the gear 100 were fully rotating.

Figure 5B:
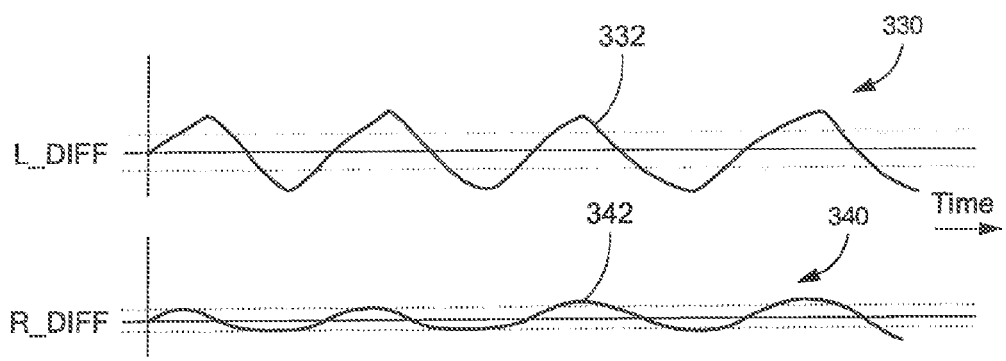

Referring now to FIG. 5B, a graph 330 has a vertical axis in arbitrary units of volts and a horizontal axis in arbitrary units of time. The graph 330 includes a signal 332 that would be generated by the motion sensor 102 of FIG. 1, when in the presence of the gear 100 when the gear experiences the rotational vibration between the angles $\Phi_1$ and $\Phi_2$ of FIG. 5A. In particular, the signal 332 can correspond to the L_DIFF signal 124a of FIG. 1. It should be understood that, though the gear 100 of FIG. 1 is not fully rotating, still the movement of the gear 100 generates the varying L_DIFF signal 124a of FIG. 1, and a resulting L_DIFF signal 332.

A graph 336 also has a vertical axis in arbitrary units of volts and a horizontal scale in arbitrary units of time. The graph 336 includes a signal 338 that would also be generated by the motion sensor 102 of FIG. 1, when in the presence of the gear 100 when the gear experiences the rotational vibration between the angles $\Phi_1$ and $\Phi_2$ of FIG. 5A. In particular, the signal 338 can correspond to the R_DIFF signal 108a of FIG. 1. It should be understood that, though the gear 100 of FIG. 1 is not fully rotating, still the movement of the gear 100 generates the varying R_DIFF signal 108a of FIG. 1, and a resulting R_DIFF signal 338.

It will be apparent that the R_DIFF signal 338 has a smaller amplitude than the L_DIFF signal 332. The different amplitudes result from the different slopes of the signal regions 322a, 324a of FIG. 5A. If the rotational vibration were to occur at gear angles other than between the angles $\Phi_1$ and $\Phi_2$ of FIG. 5A, then other relative amplitudes of the signals 332 and 338 would be generated.

It should be appreciated that the different amplitude L_DIFF and R_DIFF signals 332, 338, respectively, is representative of a vibration of the gear 100 of FIG. 1, and thus, the different amplitudes, if sufficiently different, can be used to detect a vibration.

Thus, it should be apparent that boxes 324-330 of FIG. 5 are used to correct an AGC setting of the two channels of the motion sensor 102 of FIG. 1 upon a vibration during the calibration mode of operation, the vibration resulting in an amplitude mismatch between the two channels.

The boxes 324-330 of FIG. 5 can also result in a faster calibration of the motion sensor 102 of FIG. 1 even in the absence of a vibration. Furthermore, even if the AGC count difference is not reduced at block 328, still the process can be used to detect a vibration and to set the AMP_DIFF_FLAG signal at block 328.

Referring now to FIG. 6, a process 350 is used to control the AGC and AOA of the two channels of the motion sensor 102 of FIG. 1, after the BURP mode of operation of FIG. 4, and after the calibration mode of operation of FIG. 5. The process 350 occurs during a running mode of operation, and is described for one of the right or left channel below.

At block 352, a learn window of about 440 least significant bits is selected. The learn window is centered in the full range of the DIFF signal, which, in some embodiments has nine bits for a 511 least significant bit range.

At block 354 a peak counter is reset to zero. The peak counter is used to count instances of the DDIFF signal being detected outside of the learn window.

At block 356, the process 350 identifies if a state of the POSCOMP signal 182a of FIG. 2 has changed since the last time the process 350 encountered block 356.

If there has not been a change of state of the POSCOMP signal, then the process proceeds to block 358, where it is determined if the DDIFF signal is within the learn window. If, at block 358, the DDIFF signal is outside, above or below, the learn window, then the process proceeds to block 360.

At block 360, if the value held by the peak counter is zero or one, then the process proceeds to block 362, where the AOA control signal is adjusted, for example, one or both of the offset control signals 114c, 114e of FIG. 1, are adjusted in order to move the associated DDIFF signal toward the learn window, and the process returns to blocks 356.

If, at block 356, there has been a change of state of the POSCOMP signal, then the process proceeds to block 368, wherein it is identified if the DDIFF signal has exceeded the learn window since the last switch of the state of the POSCOMP signal and there has been no AGC adjustment. If the above is true, then the process proceeds to block 369, where the peak counter is incremented by one. The process then returns to block 356.

At block 360, if the peak counter holds a value eater than one, then the process proceeds to block 364, where the AGC control signal is decremented (lower gain), for example, one or both of the gain control signals 114d, 114f of FIG. 1 are decremented in order to move the associated DDIFF signal toward the learn window. At block 366 the AOA is also adjusted in accordance with the AGC adjustment made at block 364. The process then returns to block 354.

At block 368, if the above-stated condition of block 368 is not true, then the process returns to block 354.

Referring now to FIG. 7, a graph has a vertical axis with units of voltage in volts and a horizontal axis with units in arbitrary units of time. A signal 372 is representative of a DIFF signal, for example, one of the R_DIFF signal 108a or the L_DIFF signal 124a of FIG. 1. The signal 372 is also representative of a DDIFF signal, for example, one of the R_DDIFF signal 110a or the L_DDIFF signal 126a of FIG. 1, but in analog form. More particularly, the signal 372 can be representative of the IDDIFF signal 154a of FIG. 2.

The signal 372 passes through a plurality of states, identified as STATE0 to STATE15 in FIG. 7, of which states 374a, 374b are representative. Each state is indicative of a range of values, which, in relation to a DIFF signal (an analog signal), is indicative of an analog range of values, and which, in relation to a DDIFF signal (a digital signal), is indicative of a digital range of values, and which, in relation to an IDDIFF signal (a digital signal), is also indicative of a digital range of values. The digital ranges of values, in turn, are indicative of the analog ranges of values of the MIT Exemplary ranges of values (in percentages of peak to peak range of the DDT signal, DDIFF signal, or IDDIFF signal) associated with STATE0 to STATE15 are identified as element 180b in FIG. 2.

A state signal 392 is representative of states that the DIFF signal falls into with time, which is the same as or similar to the STATE_SM signal 174a of FIG. 2. Thus, the DIFF signal 372 as shown, at some times is in STATE0, at other times in STATE1, and so on. It will be understood that at the positive peak of the DIFF signal 372, STATE15, is achieved and identified as element 392a. The DIFF signal 372 can continue above the line at STATE15 374a, and the DIFF signal 372 is still within the STATE15 392a, until the DIFF signal drops below STATE15 372a.

A signal 376 having regions 376a, 376b is representative of the PPEAK signal 158a of FIG. 2. A signal 378, including regions 378a, 378b is representative of the NPEAK signal 160a of FIG. 2. The PPEAK signal 376 generally holds a value representative of an amplitude of a positive peak of the DIFF signal 372. The NPEAK signal 378 generally holds a value representative of an amplitude of a negative peak of the MT signal 372.

The regions 376a, 376b are representative of times that the PPEAK signal 376 counts or otherwise transitions downward to reacquire the DIFF signal 372, then counts or otherwise transitions upward again to acquire the positive peak of the DIET signal 372, by way of operation of the logic 156 and comparator 164 of FIG. 2. Similarly, the regions 378a, 378b are representative of times that the NPEAK signal 378 counts or otherwise transitions upward to reacquire the DIFF signal 372, then counts or otherwise transitions downward again to acquire the negative peak of the DIFF signal 372, by way of operation of the logic 162 and comparator 166 of FIG. 2.

Points 380a, 380b are indicative of the DIFF signal transitioning from the tenth state, STATE10 to the eleventh state, STATE11. Points 382a, 382b are indicative of the DIFF signal transitioning from the fifth state, STATE5, to the fourth state, STATE4.

It will be apparent that the start of the regions 376a, 376b are coincident with the points 380a, 380b, respectively. It will also be apparent that the start of the regions 378a, 378b are coincident with the points 382a, 382b, respectively. It will become apparent from discussion below in conjunction with FIG. 7A, that the points 380a, 380b, 382a, 382b, are also coincident with transitions of the POSCOMP Points 384a, 384b are indicative of the DIFF signal changing states from STATE15 to four states below STATE15, i.e., a change to STATE 11, represented by a state difference 390. Points 386a, 386b are indicative of the DIFF signal changing from STATED to a state that is four states above STATE10, i.e., a change to STATE 4, represented by a state difference 388. It will become apparent from discussion below in conjunction with FIG. 7A, that the points 384a, 384b, 386a, 386b are also coincident with transitions of the POSCOM_PK signal.

Some state chatter (inappropriate state transitions), typified by state chatter 392, can be present during state transitions. State transition chatter is associated with the STATE_SM signal 174a of FIG. 2. The state transition chatter is essentially reduced or eliminated by the state peak logic module 176 of FIG. 2 by processes described below, to result in the STATE_PEAK signal 176a of FIG. 2 with reduced state chatter or with no state chatter.

Referring now to FIG. 7A, a graph 400 has a vertical axis with units of voltage in volts and a horizontal axis with arbitrary units of time, aligned in time with the horizontal axis of FIG. 7.

A signal 402 is representative of the POSCOMP signal 182a of FIG. 2. As described above, transitions 404a,404b and 406a, 406b of the POSCOMP signal 402 are coincident with, and result from (by way of the decoder 182 of FIG. 2), the state transitions and associated points 380a, 380b, and 382a, 382b of FIG. 7.

A signal 408, shown in phantom lines, is representative of the POSCOMP_PK signal 178 of FIG. 2, which is generated during a process described below in conjunction with FIG. 10. As described above, transitions 410a, 410b and 412a, 412h of the POSCOMP_PK signal 408 are coincident with, and result from (by way of the process of FIG. 10) the state transitions and associated points 384a, 384b, and 386a, 386b of FIG. 7.

Figure 8:
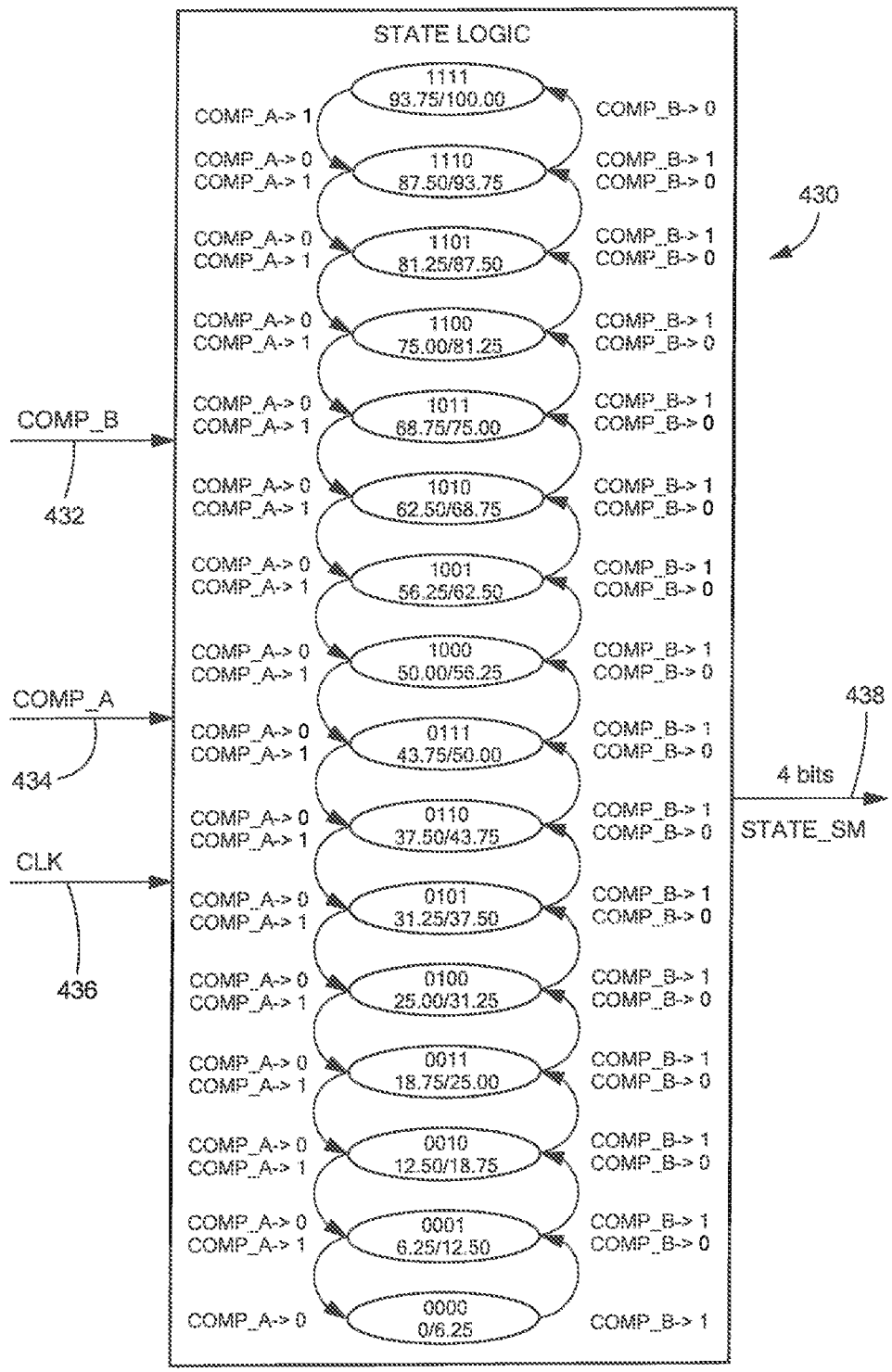
FIG. 8 is a state diagram showing a sequence of states associated with the motion sensor of FIG. 1, and, in particular, with the state logic module of FIG. 2.

Referring now to FIG. 8, the state transitions of FIG. 7 are shown in a state diagram format within a state logic module 430, which can be the same as or similar to the state logic module 174 of FIG. 2. The state logic module 430 receives a COMP_A signal 434, a COMP_B signal 432, and a clock signal 436, which can be the same as or similar to the COMP_A signal 172a, the COMP_B signal 170a, and the clock signal 184a of FIG. 2.

Within each Nibble is shown a respective one of the state numbers, 0-15, but in binary format, along with the associated value limits of each state, according to exemplary value ranges 180b shown in FIG. 2, COMP_A and COMP_B signal states are shown within the state logic module 430.

The logic transitions upward upon transitions of the state of the COMP_B signal 432 from zero to one. The logic transitions downward upon transitions of state of the COMP_A signal from zero to one.

The state logic processor 430 is configured to generate a STATE_SM signal 438, which can be the same as or similar to the STATE_SM signal 174a of FIG. 2.

The state transitions can have the above-described chatter, which can be represented as a transition first in one direction (up or down) and then in the other direction, back and forth until the proper state is achieved. The state chatter can result, for example, from noise on the COMP_A signal 434 and/or on the COMP_B signal 432, which can result, for example, from noise on the IDDIFF signal 154a of FIG. 2.

Referring now to FIG. 9, a graph 500 has a vertical axis with units of voltage in volts and a horizontal axis with arbitrary units of time. A signal 502 is representative of a DIFF signal, for example, one of the R_DIFF signal 108a or the L_DIFF signal 124a of FIG. 1. The signal 502 is also representative of a DDIFF signal, for example, one of the R_DDIFF signal 110a or the L_DDIFF signal 126a of FIG. 1.

As in FIG. 7, the signal 502 passes through a plurality of states, identified as STATE0 to STATE15 in FIG. 7, of which states 504a, 504b are representative. Each state is indicative of a range of values, which, in relation to a DIFF signal (an analog signal), is indicative of an analog range of values, and which, in relation to a DDIFF signal (a digital signal), is indicative of a digital range of values, and which, in relation to an IDDIFF signal (a digital signal), is also indicative of a digital range of values. The digital ranges of values, in turn, are indicative of the analog ranges of values of the DIFF signal.

As described above, exemplary ranges of values (in percentages of peak to peak range of the DDT signal, DDIFF signal, or MIFF signal) associated with STATE0 to STATE15 are identified as element 180b in FIG. 2.

A state signal 544 is representative of states that the DIFF signal falls into with time, and is the same as or similar to the STATE_SM signal 174a of FIG. 2. Thus, the DIFF signal 502 as shown, at some times is in STATE-0, at other times in STATE1, and so on. The DIFF signal 502 differs from the DIFF signal 372 of FIG. 7, in that it has an inflection 542, indicative of a mid-cycle change of the DIFF signal 502, as may result from a direction change, for example, a rotational direction change of the object 100 of FIG. 1, or as may result from a rotational vibration of the object 100.

A signal 506 having regions 506a, 506b is representative of the PPEAK signal 158a of FIG. 2. A signal 508, including a region 508a is representative of the NPEAK signal 160a of FIG. 2. The PPEAK signal 506 generally holds a value representative of an amplitude of a positive peak of the DIFF signal 502. The NPEAK signal 508 generally holds a value representative of an amplitude of a negative peak of the DIFF signal 502.

The regions 506a, 506b are representative of times that the PPEAK signal 506 counts or otherwise transitions downward to reacquire the DIFF signal 502, then counts or otherwise transitions upward again to acquire the positive peak of the DIFF signal 502, by way of operation of the logic 156 and comparator 164 of FIG. 2. Similarly, the region 508a is representative of times that the NPEAK signal 508 counts or otherwise transitions upward to reacquire the DIFF signal 502, then counts or transitions downward again to acquire the negative peak of the DIFF signal 502, by way of operation of the logic 162 and comparator 166 of FIG. 2.

Points 510a, 510b are indicative of the DIFF signal 502 transitioning from the tenth state, STATE10, to the eleventh state, STATE11. Point 512a is indicative of the DIFF signal 502 transitioning from the fifth state, STATE5, to the fourth state, STATE4, but only after the point 510a.

It will be apparent that the starts of the regions 506a, 506b are coincident with the points 510a, 510b, respectively. It will also be apparent that the start of the region 508a is coincident with the point 512a. It will become apparent from discussion below in conjunction with FIG. 9A, that the points 510a, 512a, 510b are also coincident with transitions of the POSCOMP signal.

Points 514a, 514b are indicative of the DIFF signal 502 changing states from STATE15 to have a state four states below STATE15, i.e., a change to STATE 11, represented by a state difference 524. Points 516a, 516b are indicative of the DIFF signal 502 changing from STATE0 to have a state that is four states above STATED, i.e., a change to STATE4, represented by state differences 520, 522. It will become apparent from discussion below in conjunction with FIG. 9A, that the points 514a, 514b, 516a, 516b are also coincident with transitions of the POSCOMP_PK signal.

An additional point 518 is indicative of the MIT signal 502 changing states from STATE8 to four states below STATE5, i.e., a change to STATE 4, represented by a state difference 526. It should be appreciated that the points 514a, 514b, and 518 are each indicative of a time when the state signal 544 decreases by four states. The points 516a, 516b are each representative of a time when the state signal 544 increase by four states.

It will become apparent from discussion below in conjunction with FIG. 9A, that the point 518 is also coincident with a transition of the POSCOMP_PK signal.

Some state chatter (inappropriate state transitions), typified by state chatter 540, can be present during state transitions. State transition chatter is associated with the STATE_SM signal 174a of FIG. 2. The state transition chatter is essentially reduced or eliminated by the state peak logic module 176 of FIG. 2 by processes described below, to result in the STATE_PEAK signal 176a of FIG. 2 with reduced state chatter or with no state chatter.

Referring now to FIG. 9A, a graph 550 has a vertical axis with units of voltage in volts and a horizontal axis with arbitrary units of time, aligned in time with the horizontal axis of FIG. 9.

A signal 552 is representative of the POSCOMP signal 182a of FIG. 2. As described above, transitions 554a, 554b, 556a of the POSCOMP signal 502 are coincident with, and result from (by way of the decoder 182 of FIG. 2), the state transitions and associated points 510a, 510b, 512a of FIG. 9.

A signal 558, shown in phantom lines, is representative of the POSCOMP_PK signal 178 of FIG. 2, which is generated during a process described below in conjunction with FIG. 10. As described above, transitions 560a, 560b, 560c, 562a, 562b of the POSCOMP_PK signal 558 are coincident with, and result from (by way of the process of FIG. 10) the state transitions and associated points 514a, 518, 514b, 516a, 516b of FIG. 9.

FIGS. 10-17 are representative of processes that are used to identify a vibration. In the partitioning described herein, these processes are carried out by the various vibration sub-processors 204-226 shown within a vibration processor 200 of FIG. 3, which can be the same as or similar to the vibration processor 116 of FIG. 1. However, it should be appreciated that the partitioning shown herein is but one exemplary partitioning of functions, shown for clarity. Any of the vibration sub-processors 202-226 of FIG. 3 can be embodied within a different block of FIG. 1, for example, within the AOA/AGC processor 114 of FIG. 1 or within the state processors 112, 128 of FIG. 1.

Each one of the processes of FIGS. 10-17 is initiated at a "start" block. The start block can be representative of a time when the motion sensor 102 of FIG. 1 is first powered up, or any time thereafter, for example, at the end of the calibration mode typified by the process of FIG. 5.

As described above, processes carried out by the channel amplitude difference processor 202 of FIG. 3 are typified by the process 300 of FIG. 5, and in particular by blocks 324-330 of FIG. 5.

Figure 10:
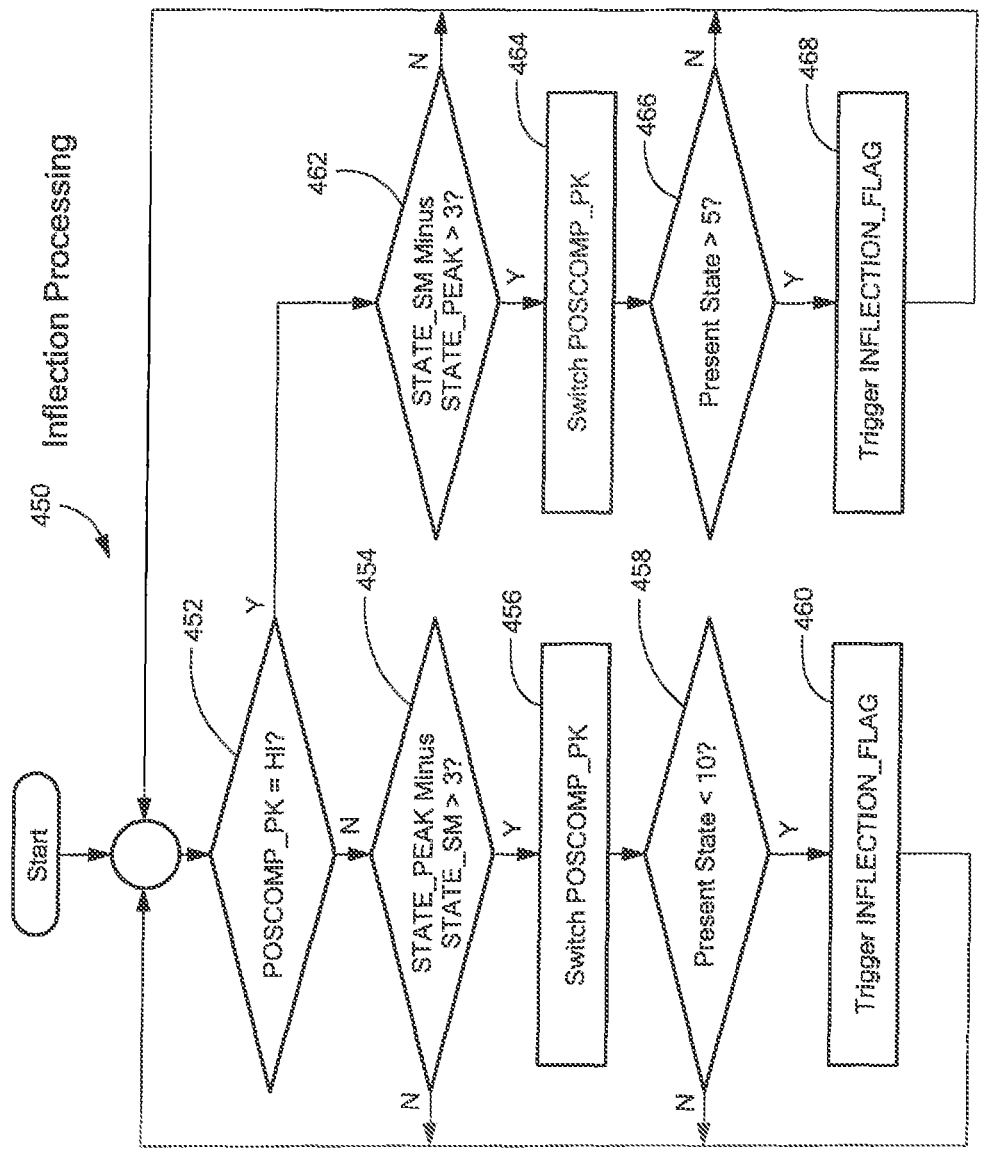
FIG. 10 is a flow chart showing inflection processing that can be used in the inflection processors of FIG. 3.

Referring now to FIG. 10, an exemplary process 450 can be carried out, for a right channel (see, e.g., FIG. 1), by the right inflection processor 204 of FIG. 3. The exemplary process 450 can also be carried out, for a left channel (see, e.g., FIG. 1), by the left inflection processor 206 of FIG. 3. Operation for the two channels can be performed either in series or in parallel. The process 450 is described below with regard to one channel, either right or left. The process 450 is used to identify an inflection and therefore a change of direction of the object 100 of FIG. 1, which is indicative of a fault condition or a vibration. The process 450 also results in transitions of the POSCOMP_PK signal.

The process 450 is concerned with identifying inflections, for example, the inflection 542 of FIG. 9, which are changes of the DIFF, DDIFF, and/or IDDIFF signals brought about by an apparent or real change of direction, for example, an apparent change of rotational direction of the object 100 of FIG. 1. The apparent change of direction can be due to a vibration of the object 100. The apparent change of direction tends to be typified by a sudden change in phase of the DIFF, DUFF, and IDDIFF signals, as shown above in conjunction with FIGS. 9 and 9A.

The process 450 begins at block 452, where it is identified if the POSCOMP_PK signal (e.g., the POSCOMP_PK signals of FIG. 1, the POSCOMP_PK signal 178 of FIG. 2, the POSCOMP_PK signals of FIG. 3, or the POSCOMP_PK, signal 558 of FIG. 9A) is high. If the POSCOMP_PK signal is not high (i.e., low), then the process proceeds to block 454.

At block 454, it is identified if a STATE_PEAK signal, e.g., the STATE_PEAK signal 176a of FIG. 2, minus the STATE_SM signal, e.g., the STATE_SM signal 174a of FIG. 2, which is represented by the state signal 544 of FIG. 9, is greater than three. In other words, their states differ by four or more. Generation of the STATE_PEAK signal is described more fully below in conjunction with FIG. 17. Let it suffice here to say that the difference of at least four states is represented by the state differences 524, 526 of FIG. 9.

If the state difference is greater than three, the process proceeds to block 456, where the POSCOMP_PK signal is switched to the opposite state, i.e., to a high state (see, e.g. point 518 of FIG. 9 in relation to edge 560b of FIG. 9A).

At block 458, if the present state, identified in the STATE_SM signal is less than or equal to ten, then the process proceed to block 460, where an INFLECTION_FLAG signal is triggered, which can be the same as or similar to one of the inflection flag signals of FIG. 3. The process 450 then returns to block 452.

As used herein, the term "triggered" refers to a momentary change of state of a flag signal, after which the flag signal reverts to its original state. The triggered sate can exist, for example, for one cycle of the clock signal 184a of FIG. 2.

If at block 452, the POSCOMP_PK signal is high, then the process proceeds to block 462, where it is identified if a STATE_SM signal minus the STATE_PEAK signal is greater than three. In other words, their states differ by four or more.

If the state difference is greater than three, the process proceeds to block 464, where the POSCOMP_PK signal is switched to the opposite state, i.e., to a low state (see, e.g. point 516b of FIG. 9 in relation to edge 562b of FIG. 9A)

At block 466 if the present state, identified in the STATE_SM signal is greater than five, then the process proceed to block 468, where the INFLECTION_FLAG signal is triggered and the process 450 returns to block 452.

At blocks 454, 458, 462, 466, if the indicated conditions are false, then the process returns to block 452.

It should be recognized that edges of the POSCOMP_PK signal are a result of the process 450.

The process 450 can continually scan the DOFF or IDDIFF signals for inflections and trigger the INFLECTION_FLAG of the right or left channel if an inflection is detected. The process 450 can continually generate the POSCOMP_PK signal.

Referring now to 11, an exemplary process 570 can be performed by the direction change processor 208 of FIG. 3. The process 570 can be carried out for the two channels, right and left, either in series or in parallel. The process 570 is described below with regard to both channels. In general, it should be appreciated that a relative phase (plus or minus) between the R_POSCOMP signal 112a of FIG. 1 and the L_POSCOMP signal 128a of FIG. 1 is indicative of a direction of rotation of the object 100 of FIG. 1, and a change of the relative phase, particularly a change in sign of the relative phase, is indicative of a change of direction of rotation of the object 100. The process 570 is used to identify a change of direction of the object 100 of FIG. 1, which is indicative of a fault condition or a vibration.

The process 570 begins at block 572, where, if an edge is detected in the L_POSCOMP signal, the process 570 proceeds to block 574.

At block 574, if a detected direction of movement (sign of phase between R_POSCOMP signal and L_POSCOMP signal) has changed since the last edge of the L_POSCOMP signal, then the process proceeds to block 576.

At block 576, it is determined if a "direction validation edge counter" for both the right and left channels is greater than zero. The direction validation edge counter is described in conjunction with block 1022 of FIGS. 1.9-19B. In essence, the direction validation edge counter is reset to zero when there has been a vibration detected in either the right or the left channel by the process of FIGS. 19-19B.

At block 576, if the L_POSCOMP edge is the first edge, then the process proceeds to block 578.

Figure 16:
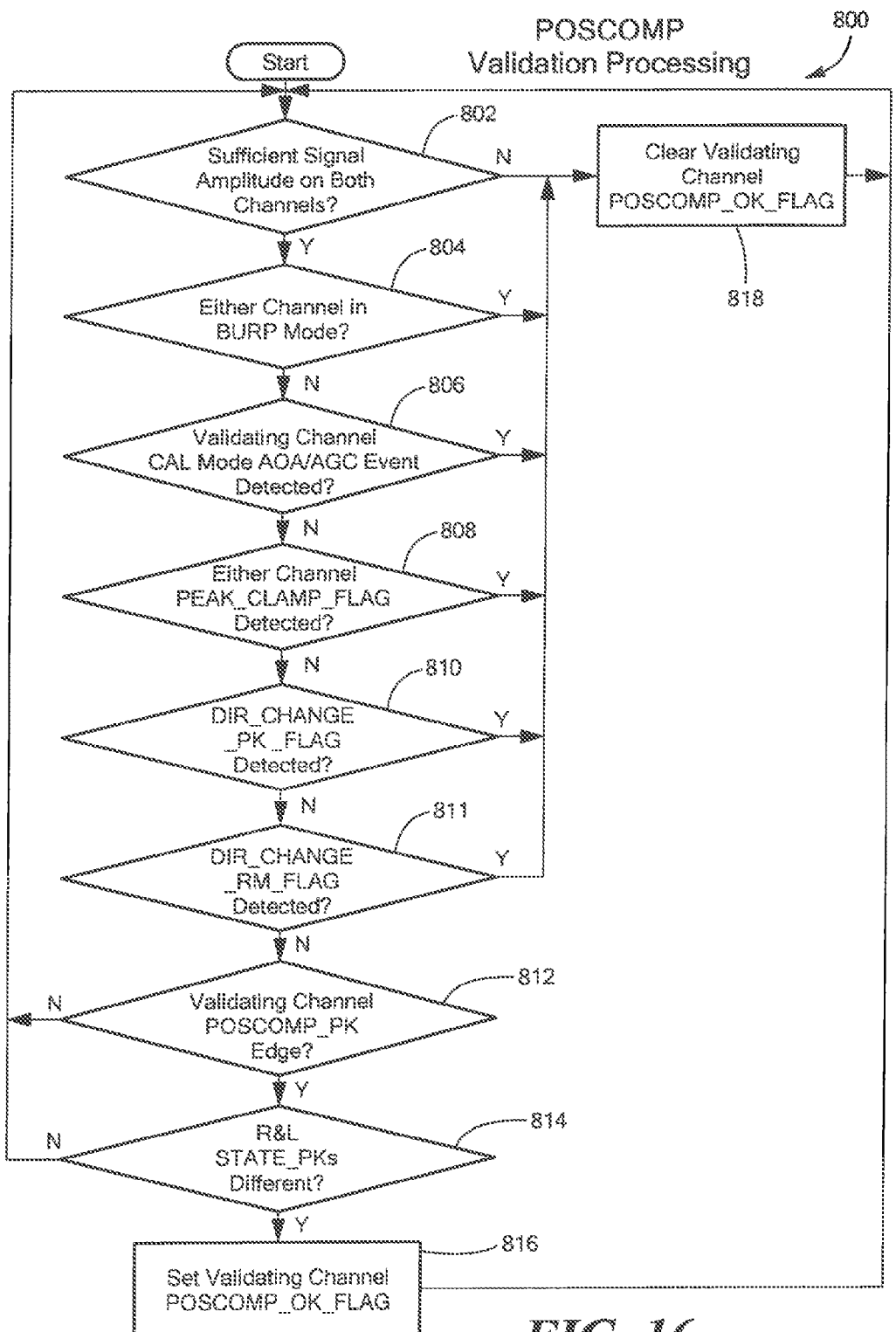
FIG. 16 is a flow chart showing POSCOMP validation processing that can be used in the POSCOMP validation processors of FIG. 3.

At block 578, it is determined whether the L_POSCOMP signal and the R_POSCOMP signal have both been validated, for example with the process of FIG. 16. If both are validated, both of the POSCOMP_OK_FLAGS of FIG. 3 will be set. If both are validated, the process proceeds to block 580.

At block 580 it is determined if there is sufficient amplitude in both the right and the left channels. This determination can be made in a variety of ways. In one particular embodiment, differences between the PPEAK signal (158a, FIG. 2) and the NPEAK signal (160a, FIG. 2) can be compared with a predetermined threshold.

If at block 580, it is determined that the amplitude of both channels is sufficiently high, the process proceeds to block 582, where the DIR_CHANGE_FLAG signal of FIG. 3 is triggered and the process returns to block 572.

At block 572 if an L_POSCOMP edge is not detected, then the process proceeds to block 584, where, if an Edge is Detected in the R_POSCOMP Signal, the Process 570 Proceeds to block 586.

At block 586, if a detected direction of movement (sign of phase between R_POSCOMP signal and L_POSCOMP signal) has changed since the last edge of the R_POSCOMP signal, then the process proceeds to block 576.

If at block 584, there is no R_POSCOMP edge (and no L_POSCOMP edge) then the process 570 proceeds to block 588.

At block 588, it is determined if there has been a combined total of three POSCOMP and POSCOMP_PK edges on one channel without a POSCOMP or POSCOMP_PK edge on the other channel. If this condition is true, then the process proceeds to block 582, where the DIR_CHANGE_FLAG signal is triggered. If this condition is false, then the process 570 returns to block 572.

If the conditions of any of the blocks 574-580, 586, or 588 are false, then the process returns to block 572.

Figure 12:
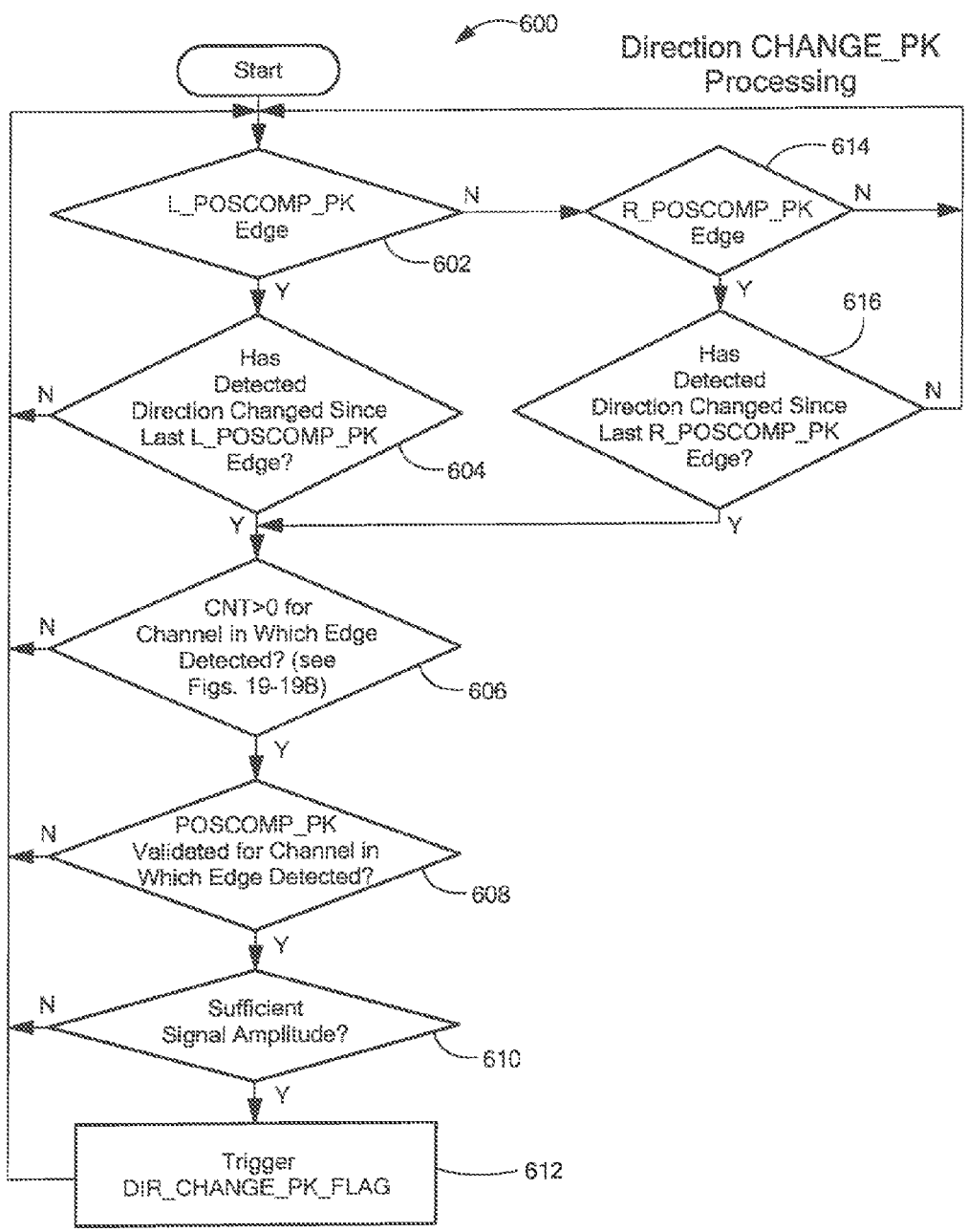
FIG. 12 is a flow chart showing direction change_PK processing that can be used in the direction change_PK processor of FIG. 3.

Referring now to FIG. 12, an exemplary process 600 can be performed by the direction change_PK processor 210 of FIG. 3. The process 600 can be carried out for the two channels, right and left, either in series or in parallel. The process 600 is described below with regard to both channels. The process 600 is used to identify a change of direction of the object 100 of FIG. 1, which is indicative of a fault condition or a vibration.

The process begins at block 802, where, if an edge is detected in the L_POSCOMP_PK signal, the process 600 proceeds to block 604.

At block 604, if a detected direction of movement (sign of phase between R_POSCOMP signal and L_POSCOMP signal) has changed since the last edge of the L_POSCOMP_PK signal, then the process 600 proceeds to block 606.

At block 606, it is determined if the "direction validation edge counter" is greater than zero for the channel in which the edge was detected. The direction validation edge counter is described in conjunction with block 1022 of FIGS. 19-19B.

Figure 19:
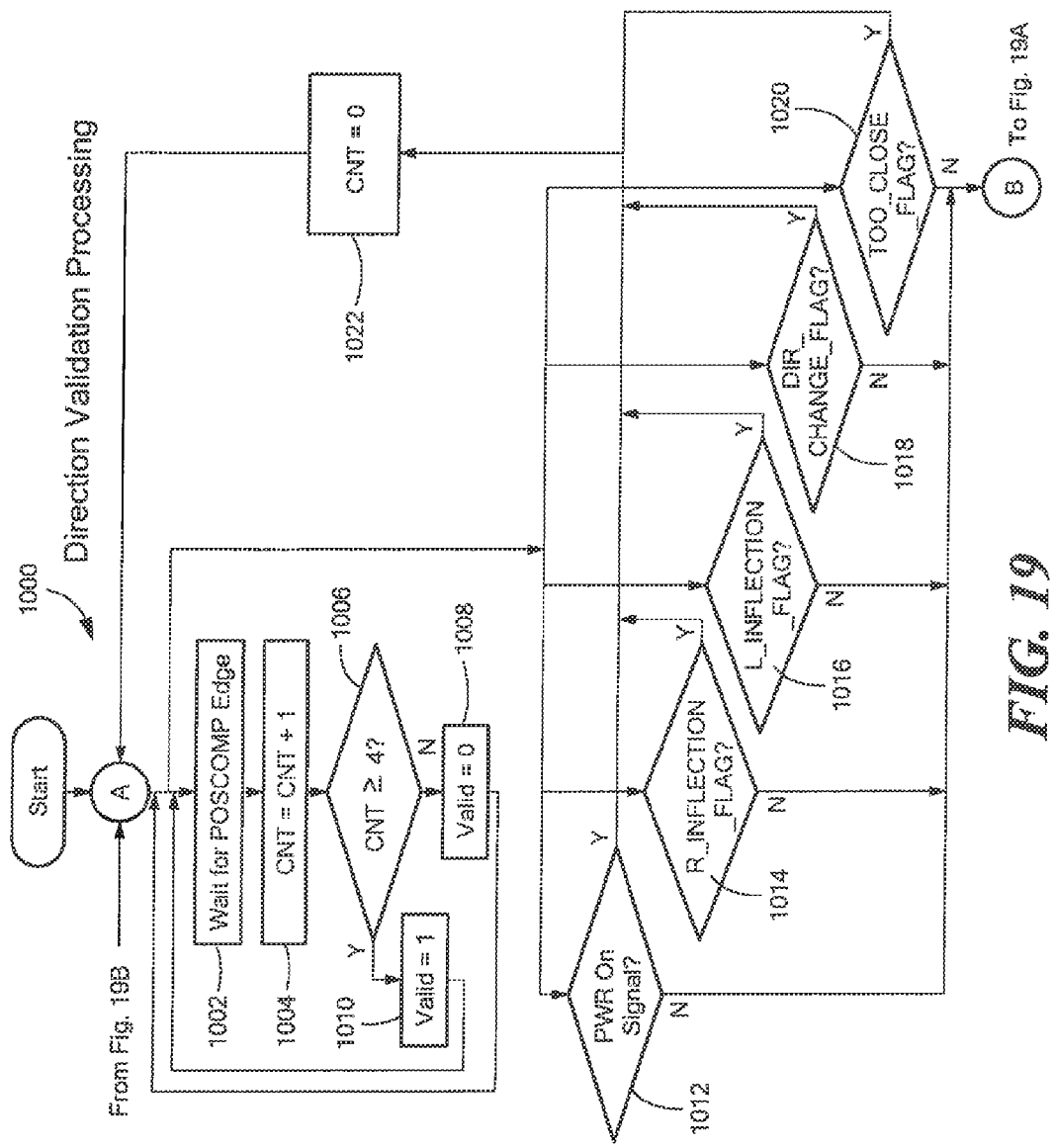
FIGS. 19-19B taken together are a flow chart showing a process for generating the modified direction validation window of FIG. 18A.
Figure 19A:
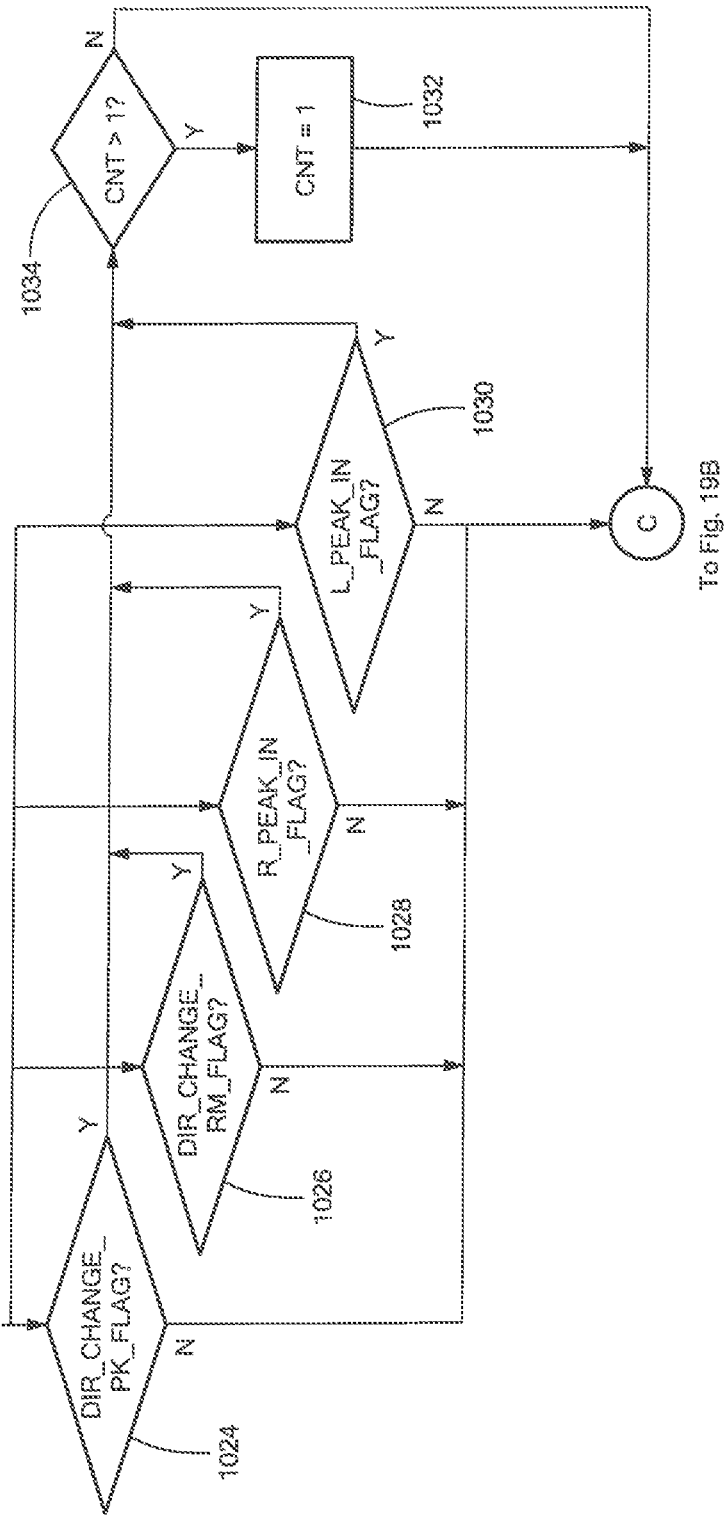
Figure 19B:
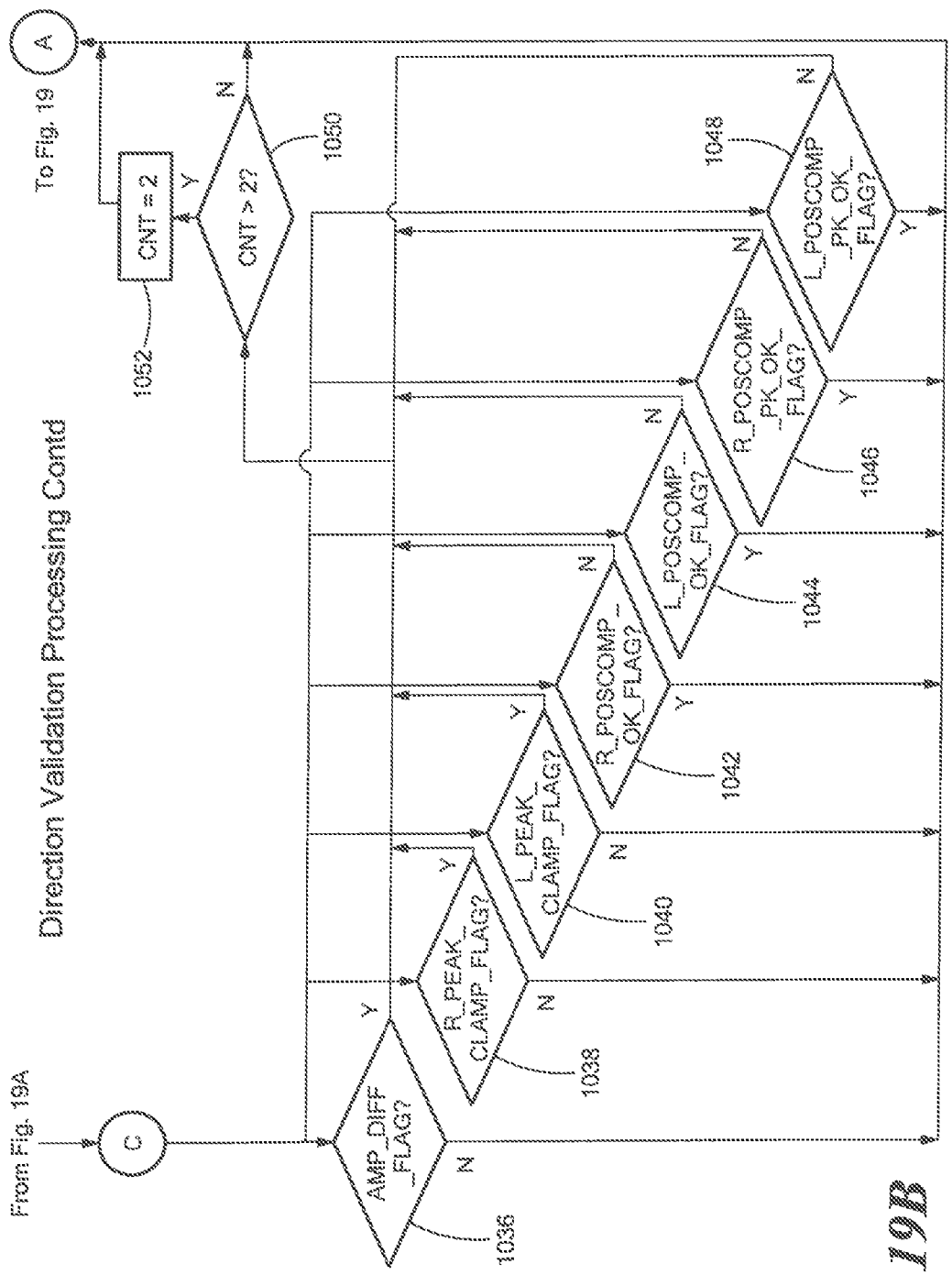

At block 606, if the direction validation counter (CNT) of FIGS. 19-19B is greater than zero for the channel in which the edge was detected, then the process 600 proceeds to block 608.

At block 608, it is determined whether the POSCOMP_PK signal has been validated (POSCOMP_PK_OK_FLAG set, see FIG. 3) for the channel, right or left, in which the edge was detected at blocks 602 or 604.

At block 610 it is determined if there is sufficient amplitude in both the right and the left channels. This determination can be made in a variety of ways. In one particular embodiment, differences between the PPEAK signal (158a, FIG. 2) and the NPEAK signal (160a, FIG. 2) can be compared with a predetermined threshold.

If at block 610, it is determined that the amplitude of both channels is sufficiently high, the process proceeds to block 612, where the DIR_CHANGE_PK_FLAG signal of FIG. 3 is triggered, and the process returns to block 602.

At block 602 if an L_POSCOMP_PK edge is not detected, then the process proceeds to block 614, where, if an edge is detected in the R_POSCOMP_PK signal, the process 600 proceeds to block 616.

At block 616, if a detected direction of movement (sign of phase between R_POSCOMP signal and L_POSCOMP signal) has Changed since the last edge of the R_POSCOMP_PK signal, then the process proceeds to block 608.

If at block 614, there is no R_POSCOMP_PK edge (and no L_POSCOMP_PK edge) then the process 600 returns to block 602.

If the conditions of any of the blocks 604-610, 614, 616 are false, then the process returns to block 602.

Figure 13:
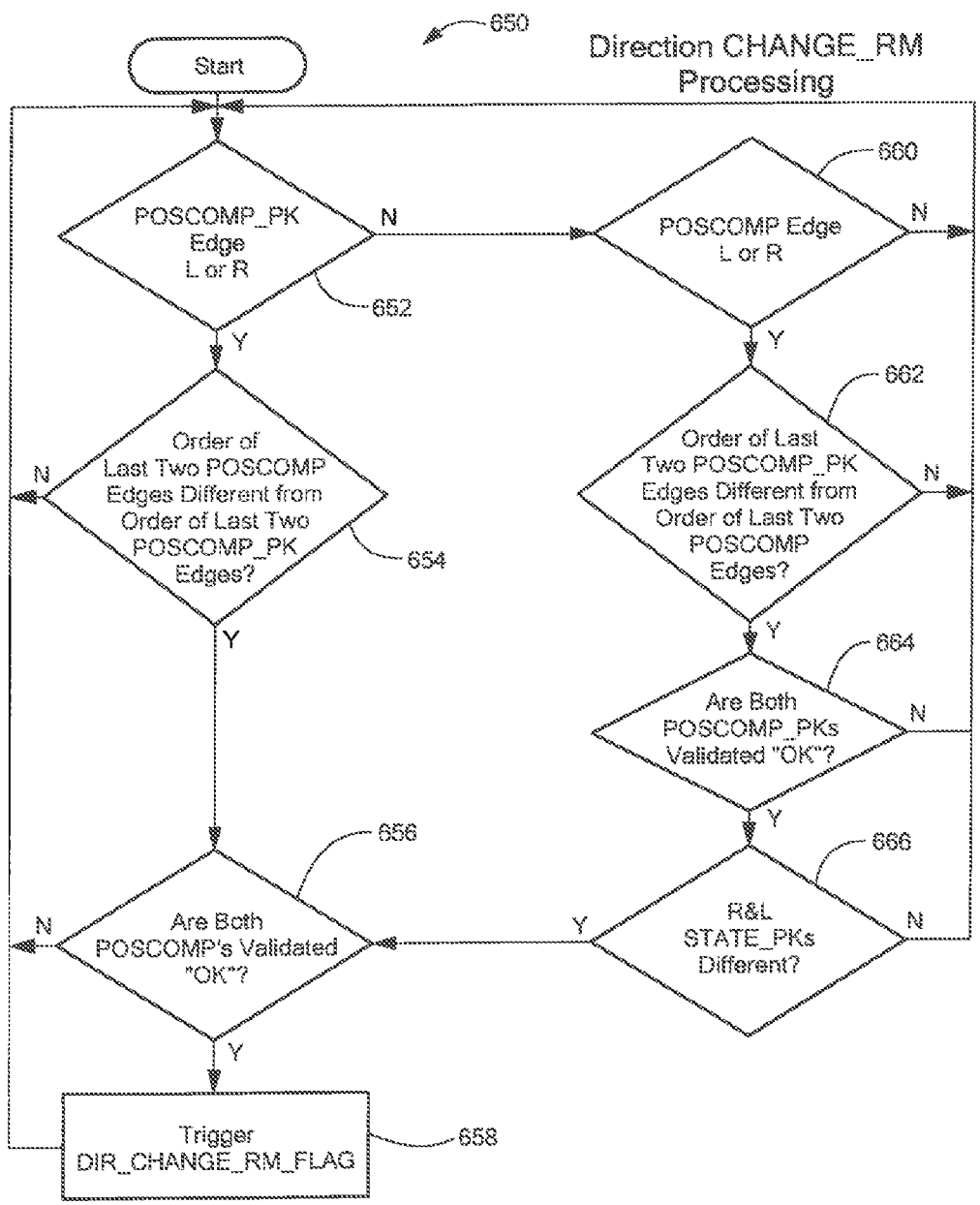
FIG. 13 is a flow chart showing direction change_RM processing that can be used in the direction change_RM processor of FIG. 3.

Referring now to FIG. 13, an exemplary process 650 can be performed by the direction change_RM (running mode) processor 212 of FIG. 3, The process 650 can be carried out for the two channels, right and left, either in series or in parallel. The process 650 is described below with regard to both channels. The process 650 is used to identify a change of direction of the object 100 of FIG. 1, which is indicative of a fault condition or a vibration.

The process 650 begins at block 652, where the POSCOMP_PK signal of both the right and the left channel is inspected. If an edge (transition) is detected in the POSCOMP_K of either the right or the left channel, the process 650 proceeds to block 654.

At block 654, an order (right, left) of the last two edges of the POSCOMP signals in the right and left channels (i.e., a phase sign) is compared with an order of the last two edges of the POSCOMP_PK signals in the right and left channels. The last two POSCOMP_PK edges include the one just detected at block 652. If the order is the different for the POSCOMP signals than for the POSCOMP_PK signals, then the process proceeds to block 656.

At block 656, if the POSCOMP signals are validated in both the right and left channels, for example, by the process 800 of FIG. 16, then the process continued to block 658, where the DIR_CHANGE_RM_FLAG signal (see FIG. 3) is triggered momentarily, e.g., for one cycle of the clock signal 184a of FIG. 2, and the process returns to block 652.

At block 652, if an edge is not detected in the POSCOMP_PK signal of either the right or the left channels, then the process proceeds to block 660, where the POSCOMP signals are inspected. If at block 660, a transition is detected in the POSCOMP signal of either the right or the left channel, then the process proceeds to block 662.

At block 662, an order (right, left) of the last two edges of the POSCOMP_PK signals in the right and left channels (i.e., a phase sign) is compared with an order of the last two edges of the POSCOMP signals in the right and left channels. The last two POCOMP edges include the one just detected at block 660. If the order is the different for the POSCOMP signals and for the POSCOMP_PK signals, then the process proceeds to block 664.

Figure 16A:
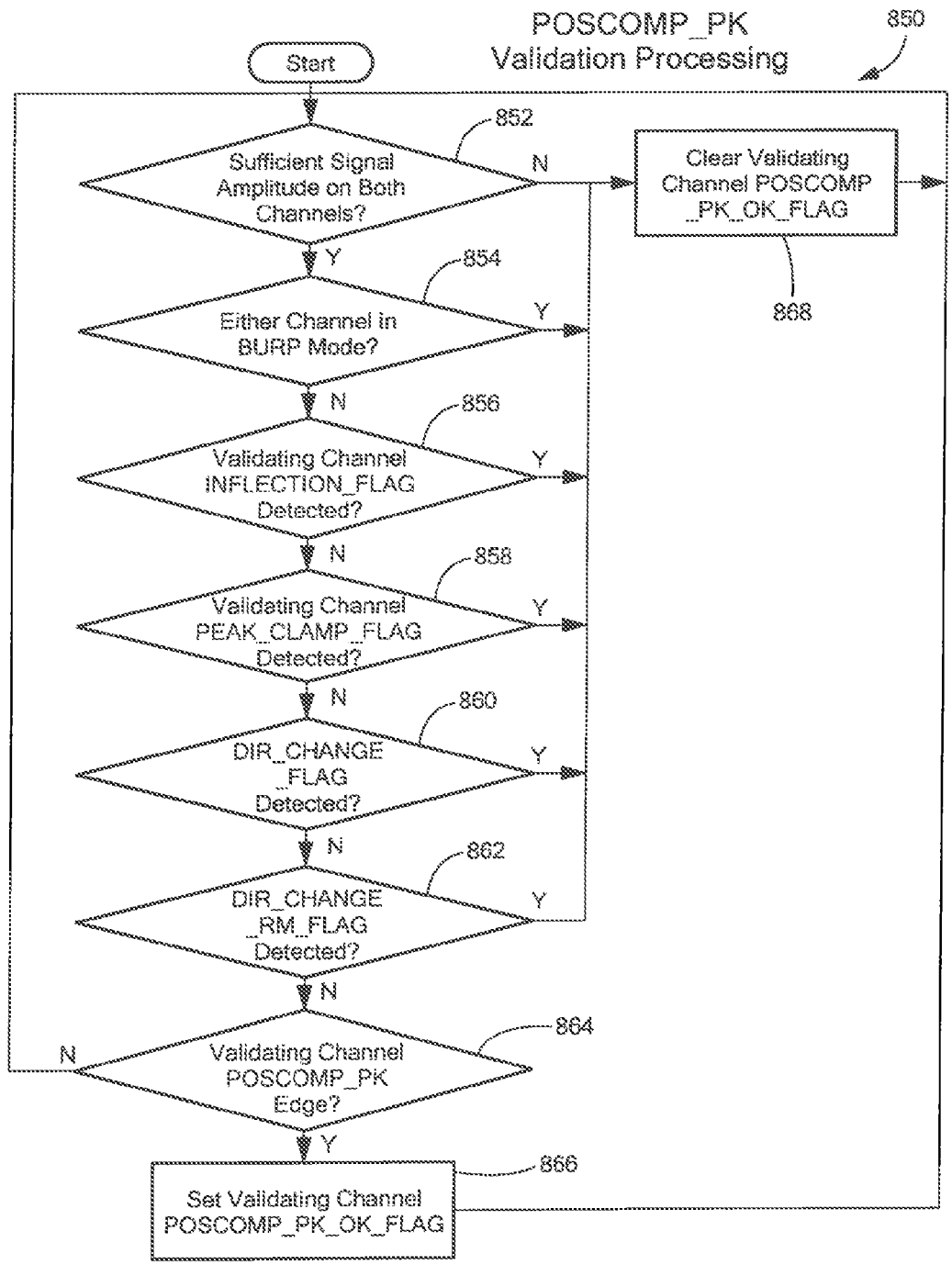
FIG. 16A is a flow chart showing POSCOMP_PK validation processing that can be used in the POSCOMP_PK validation processors of FIG. 3.

At block 664, if the POSCOMP_PK signals are validated in both the right and left channels, for example, by the process 850 of FIG. 16A, then the process continues to block 666.

At block 666, it is determined if the states indicated in the STATE_PK state signals of the right and left channels are different. If the states are different, then the process proceeds to block 656. If the states are not different in the two channels, then the process 650 returns to block 652.

At block 660, if an edge is not detected in the POSCOMP signal of either the right or the left channels, the process 650 returns to block 652. Blocks 652, 660 essentially loop until a transition is detected in either a POSCOM_PK signal or in a POSCOMP signal of either the right or the left channel.

At block 662, if the order of transitions is not different in the POSCOMP_PK signal from is the order of transitions in the POSCOMP signal having a transition detected at block 660, then the process returns to block 652.

At block 664, if the POSCOMP_PK signals are not validated to be OK, then the process 650 returns to block 652.

If the conditions of blocks 654 or 656 are not true, then the process returns to block 652.

Figure 14:
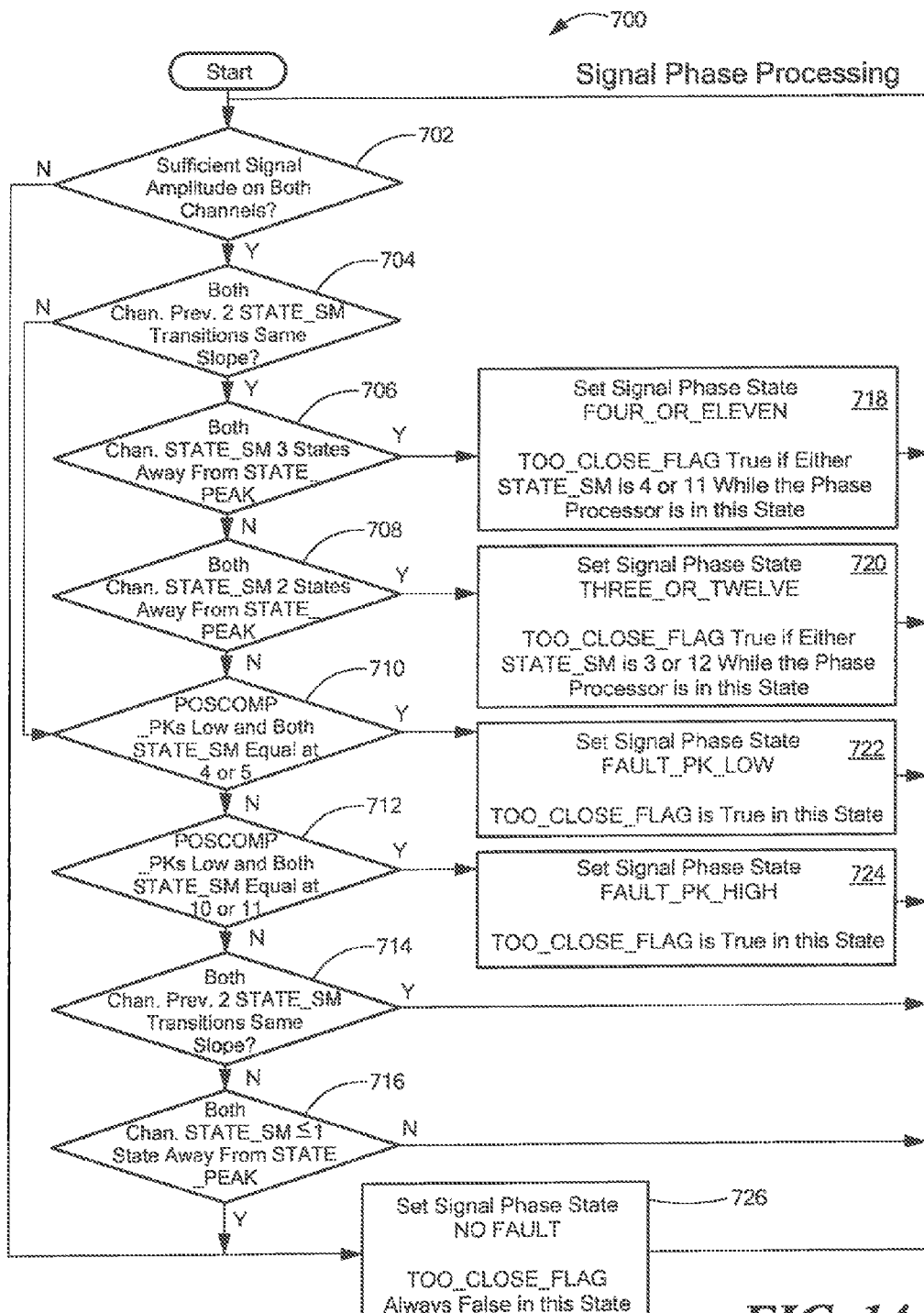
FIG. 14 is a flow chart showing signal phase processing that can be used in the signal phase processor of FIG. 3.

Referring now to FIG. 14, an exemplary process 700 can be performed by the signal phase processor 214 of FIG. 3. The process 700 can be carried out for the two channels, right and left, either in series or in parallel. The process 700 is described below with regard to both channels. The process 700 is used to identify a phase mismatch between the right and left channels of sufficient magnitude so as to be indicative of a fault condition or a vibration.

The process 700 begins at block 702, where it is determined if the signal amplitude of both the right and the left channels (DIFF signal, DDIFF signal, or IDDIFF signal of FIGS. 1 and 2) have sufficient amplitude. Such a determination is described above in conjunction with block 580 of FIG. 11. If the amplitude of both the right and the left channels is sufficient, the process 700 proceeds to block 704.

At block 704 it is determined if both the STATE_SM signal of both the right and the left channels have been indicative of the same slope (upward or downward state transitions) for at least the last two changes of state of the right and left channel STATE_SM signals. If this condition is true, then the process proceeds to block 706.

At block 706, it is determined if the STATE_SM signals of both the right and the left channels are three states away from the associated STATE_PEAK signal of the right and the left channels. If this condition is false, then the process proceeds to block 708.

At block 708, it is determined if the STATE_SM signals of both the right and the left channels are two states away from the associated STATE_PEAK signal of the right and the left channels. If this condition is false, then the process proceeds to block 710.

At block 710, it is determined if the right and left channel POSCOMP_PK signals are low and if the right and left channel STATE_SM signals are indicative of state 4 or 5. If this condition is false, then the process proceeds to block 712.

At block 712, it is determined of the right and left channel POSCOMP_PK signals are high and if the right and left channel STATE_SM signals are indicative of state 10 or 11. If this condition is false, then the process proceeds to block 714.

At block 714, like at block 704, it is determined if both the STATE_SM signal of both the right and the left channels have been indicative of the same slope (upward or downward state transitions) for at least the last two changes of state of the right and left channel STATE_SM signals. If this condition is false, then the process proceeds to block 716.

At block 716, it is determined if both the right and left channel STATE_SM signals are less than or equal to one state away from the associated STATE_PEAK signal. If this condition is true, then the process proceeds to block 726, where the TOO_CLOSE_FLAG signal of FIG. 3 is cleared, i.e., set to false.

If at block 706, the condition described above in conjunction with block 706 is true, then the process proceeds to block 718. At block 718, the TOO_CLOSE_FLAG signal of FIG. 3 is set to true if the right or left channel STATE_SM signal is indicative of state 4 or 11. The process then returns to block 702.

If at block 708, the condition described above in conjunction with block 708 is true, then the process proceeds to block 720. At block 720, the TOO_CLOSE_FLAG signal is set to true if the right or left channel STATE_SM signal is indicative of state 3 or 12. The process then returns to block 702.

If at block 710, the condition described above in conjunction with block 710 is true, then the process proceeds to block 722. At block 722, the TOO_CLOSE signal is set to true. The process then returns to block 702.

If at block 712, the condition described above in conjunction with block 712 is true, then the process proceeds to block 724. At block 724, the TOO_CLOSE signal is set to true. The process then returns to block 702.

If at block 702, the condition described above in conjunction with block 702 is false, then the process proceeds to block 726.

If at block 704, the condition described above in conjunction with block 704 is false, then the process proceeds to block 710.

If the conditions described above in conjunction with blocks 714 or 716 are true and false, respectively, then the process returns to block 702.

Figure 15:
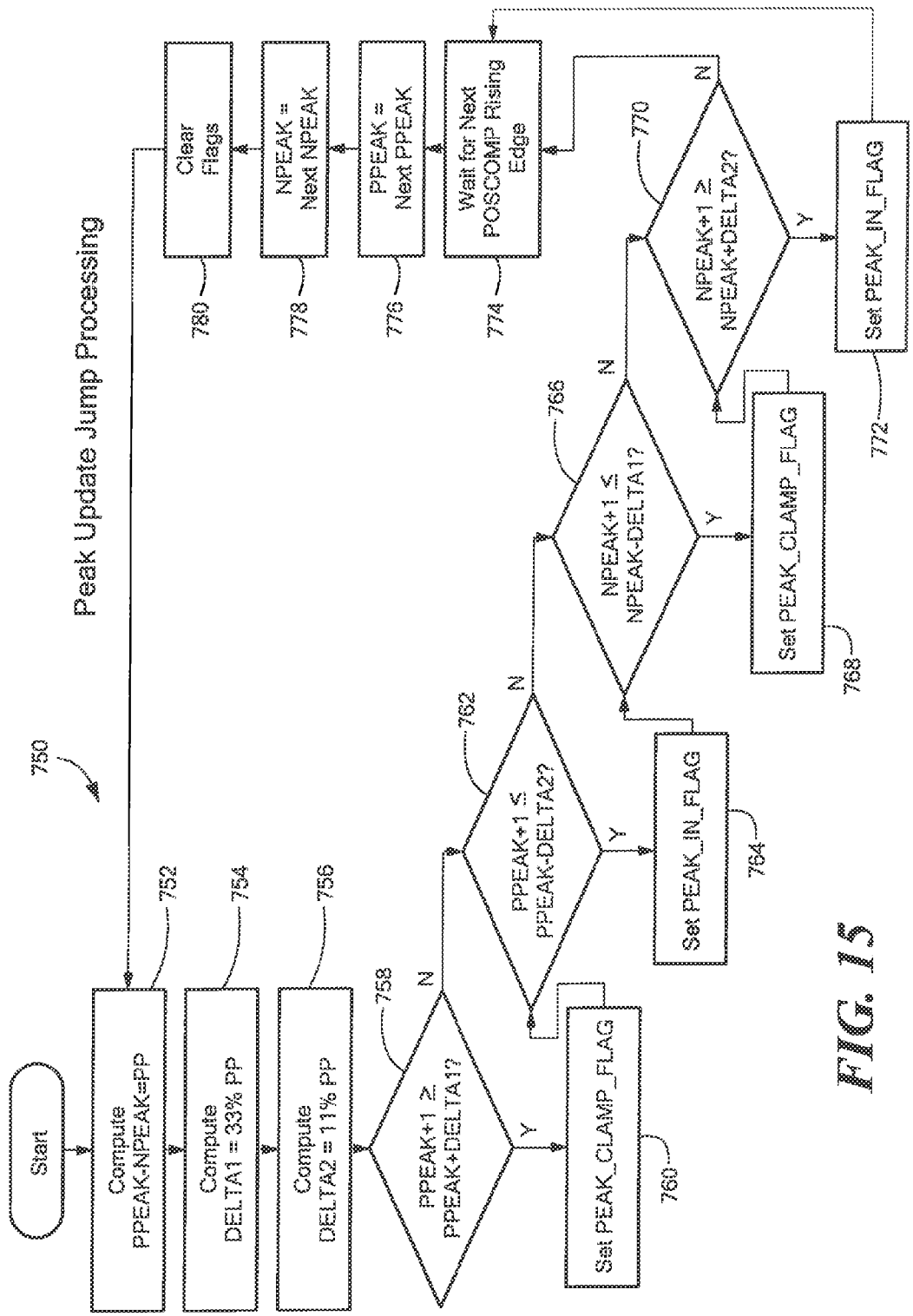
FIG. 15 is a flow chart showing signal peak jump processing that can be used in the peak update jump processors of FIG. 3.

Referring now to FIG. 15, an exemplary process 750 can be performed by peak update jump processors 216, 218 of FIG. 3. The process 750 can be carried out for the two channels, right and left, either in series or in parallel. The process 750 is described below with regard to only one channel. The process 750 is used to identify an amplitude jump in the right or left channels (DIFF signal, DDIFF signal, or IDDIFF signal) of sufficient magnitude to be indicative of a fault condition or a vibration.

The process begins at block 752, where a signal magnitude (DIFF sign 1, DDIFF signal, or IDDIFF signal) is computed by taking a difference between the PPEAK signal 158a (FIG. 2) and the NPEAK signal 160a (FIG. 2), resulting in a peak-to-peak magnitude (PP) value. At block 754 a first difference value (DELTA1) is computed as 33% of the PP value. At block 756, a second difference value (DELTA2) is computed as 11% of the PP value.

At block 758 it is determined if the next positive peak value (PPEAK+1) is greater than or equal to the prior positive peak value (PPEAK) plus the first difference value (DELTA1). IF the condition is true, then the process proceeds to block 760, where the PEAK_CLAMP_FLAG signal of FIG. 3 is set and the process proceeds to block 762. If the condition is false, then the process also proceeds to block 762.

At block 762, it is determined if the next positive peak value (PPEAK+1) is less than or equal to the prior positive peak value (PPEAK) minus the second difference value (DELTA2). If the condition is true, then the process proceeds to block 764, where the PEAK_IN_FLAG signal of FIG. 3 is set and the process proceeds to block 766. IF the condition is false, then the process also proceeds to block 766.

At block 766 it is determined if the next negative peak value (NPEAK+1) is less than or equal to the prior negative peak value (NPEAK) minus the first difference value (DELTA1). If the condition is true, then the process proceeds to block 768, where the PEAK_CLAMP_FLAG signal of FIG. 3 is set and the process proceeds to block 770. If the condition is false, then the process also proceeds to block 770.

At block 770 it is determined if the next negative peak value (NPEAK+1) is greater than or equal to the prior negative peak value (NPEAK) plus the second difference value (DELTA2). If the condition is true, then the process proceeds to block 772, where the PEAK_IN_FLAG of FIG. 3 is set and the process proceeds to block 774. If the condition is false, then the process also proceeds to block 774.

At block 774, the process 750 waits for the next POSCOMP rising edge in the channel being processed.

At block 776, the PPEAK value takes on the next PPEAK value and at block 778, the NPEAK value takes on the next NPEAK value. At block 780, an flags set in blocks 760, 764, 768, or 772 are cleared. The process then returns to block 752.

Referring now to FIG. 16, an exemplary process 800 can be performed by POSCOMP validation processors 220, 222 of FIG. 3. The process 800 can be carried out for the two channels, right and left, either in series or in parallel. The process 800 is described below with regard to only one channel, but uses the other channel in some of the blocks. The process 800 is used to identify a proper POSCOMP signal. An improper POSCOMP signal can be indicative of a fault or vibration condition.

The process 800 begins at block 802, where it is determined if the signal amplitude of both the right and the left channels (DIFF signal, MIFF signal, or IDDIFF signal of FIGS. 1 and 2) have sufficient amplitude. Such a determination is described above in conjunction with block 580 of FIG. 11. If the amplitude of both the right and the left channels is sufficient, the process 800 proceeds to block 804.

At block 804, it is determined if the motion sensor 102 of FIG. 1 is presently in the BURP mode of operation described above in conjunction with FIG. 4. The BURP mode of operation can occur shortly after the motion sensor 102 first receives power. If the motion sensor 102 is not presently in the BURP mode of operation, then the process 800 proceeds to block 806.

At block 806, it is determined if the motion sensor 102 is presently in the calibration mode of operation described above in conjunction with FIG. 5 and whether an AOA/AGC event occurs. The calibration mode of operation can occur shortly after the motion sensor 102 is in the BURP mode of operation or at other times. If the motion sensor 102 is not presently in the calibration mode of operation, then the process 800 proceeds to block 808.

A block 808, it is determined if the PEAK_CLAMP_FLAG signal of FIGS. 3 and 15 is detected in the channel, right or left, being validated. If the PEAK_CLAMP_FLAG signal is not detected, then the process proceeds to block 810.

At block 810, it is determined if the DIR_CHANGE_PK_FLAG signal of FIGS. 3 and 12 is detected (set). If the DIR_CHANGE_FLAG signal is not detected, then the process proceeds to block 811.

At block 811, it is determined if the DIR_CHANGE_RM_FLAG signal of FIGS. 3 and 13 is detected (set). If the DIR_CHANGE_RM_FLAG signal is not detected, then the process proceeds to block 812.

At block 812, it is determined if an edge (transition) of the POSCOMP signal is detected in the channel, right or left, being validated. If the POSCOMP edge is detected, then the process proceeds to block 814.

At block 814, it is determined if the states indicated by the right and left channel STATE_PK signals are different. If the indicated states are different, then the process proceeds to block 816, wherein the POSCOMP_OK_FLAG signal is set in the channel, right or left, being validated. Setting of the POSCOMP_OK_FLAG signal is indicative of a validated POSCOMP signal. The process 800 then returns to block 802.

If the condition at block 802 is false or if the conditions of any of the blocks 804-811 are true, then the process 800 proceeds to block 818, where the POSCOMP_OK_FLAG signal is cleared in the channel, right or left, being validated, indicative of a non-validated POSCOMP signal, and then the process 800 returns to block 802

If the condition of block 812 and 814 are false, then the process returns to block 802.

Referring now to FIG. 16A, an exemplary process 850 can be performed by POSCOMP_PK validation processors 224, 226 of FIG. 3. The process 850 can be carried out for the two channels, right and left, either in series or in parallel. The process 850 is described below with regard to only one channel, but uses the other channel in some of the blocks. The process 850 is used to identify a proper POSCOMP_PK signal. An improper POSCOMP_PK signal can be indicative of a fault or vibration condition.

The process 850 begins at block 852, where it is determined if the signal amplitude of both the right and the left channels (DIFF signal, DDIFF signal, or IDDIFF signal of FIGS. 1 and 2) have sufficient amplitude. Such a determination is described above in conjunction with is block 580 of FIG. 11. If the amplitude of both the right and the left channels is sufficient, the process 850 proceeds to block 854.

At block 854, it is determined if the motion sensor 102 of FIG. 1 is presently in the BURP mode of operation described above in conjunction with FIG. 4. The BURP mode of operation can occur shortly after the motion sensor 102 first receives power. If the motion sensor 102 is not presently in the BURP mode of operation, then the process 850 proceeds to block 856.

At block 856, it is determined if the INFLECTION_FLAG signal of FIGS. 3 and 10 is detected in the channel, right or left, being validated. If the INFLECTION_FLAG signal is not detected, then the process 850 proceeds to block 858.

At block 858, it is determined if the PEAK_CLAMP_FLAG signal of FIGS. 3 and 15 is detected in the channel, right or let being validated. If the PEAK_CLAMP_FLAG signal is not detected, then the process proceeds to block 860.

Figure 11:
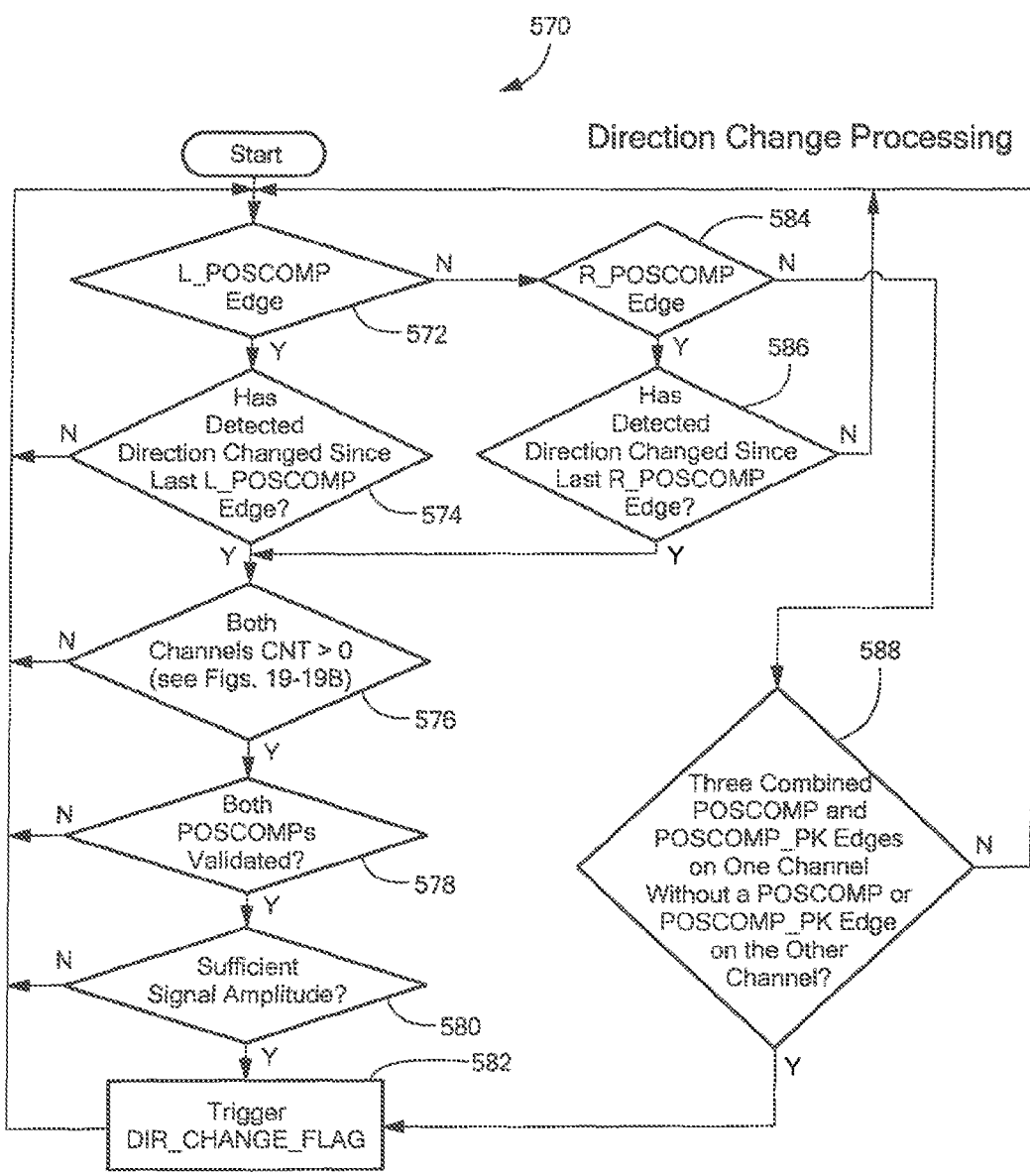
FIG. 11 is a flow chart showing direction change processing that can be used in the direction change processor of FIG. 3.

At block 860, it is determined if the DIR_CHANGE_FLAG signal of FIGS. 3 and 11 is detected (set). If the DIR_CHANGE_FLAG signal is not detected, then the process proceeds to block 862.

At block 862, it is determined if the DIR_CHANGE_RM_FLAG signal of FIGS. 3 and 13 is detected (set). If the DIR_CHANGE_RM_FLAG signal is not detected, then the process proceeds to block 864.

At block 864, it is determined if an edge (transition) of the POSCOMP_PK signal is detected (set) in the channel, right or left, being validated. If the POSCOMP_PK edge is detected, then the process 850 proceeds to block 866.

At block 866, the POSCOMP_PK_FLAG signal is set in the channel, right or let being validated. Setting of the POSCOMP_PK_OK_FLAG signal is indicative of a validated POSCOMP_PK signal. The process 850 then returns to block 852.

If the condition at block 852 is false or if the conditions of any of the blocks 854-862 are true, then the process 850 proceeds to block 868, where the POSCOMP_PK_OK_FLAG signal is cleared, indicative of a non-validated POSCOMP_PK signal, and then the process 850 returns to block 852.

If the condition of block 864 is false, then the process returns to block 852.

Figure 17:
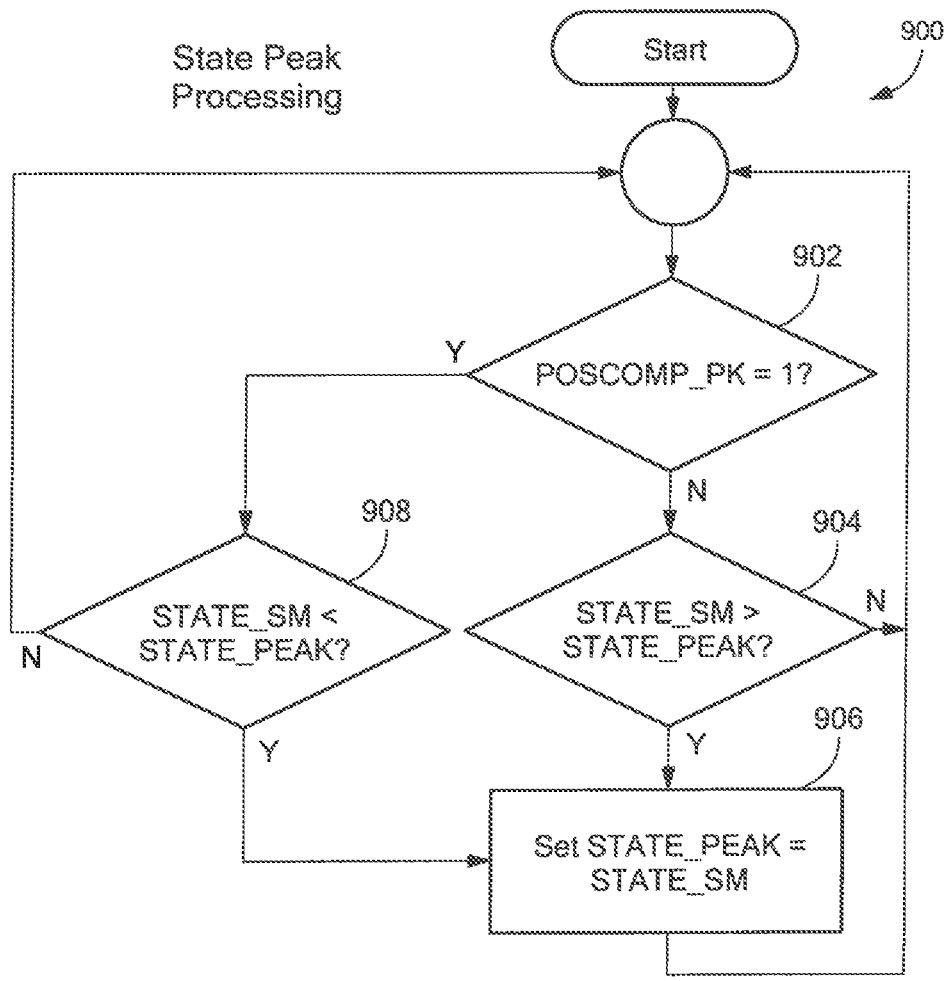
FIG. 17 is a flow chart showing state peak processing that can be used in the state peak logic module of FIG. 2.

Referring now to FIG. 17, a process 900 can be used to generate the STATE_PEAK signal 176a of FIG. 2 from the STATE_SM signal 174a of FIG. 2. As described above, the STATE_PEAK signal 176a has reduced state chatter from that which may be present in the STATE_SM signal 174a.

The process 900 begins at step 902, where it is determined if the POSCOMP_PK signal of FIGS. 2, 7A, 9A, and 10 is in a high state (a one). If the POSCOMP_PK signal is not in a high state, the process 900 proceeds to block 904.

At block 904, it is determined if a state indicated by the STATE_SM signal is greater than a state indicated by the STATE_PEAK signal. If the condition is true, the process 900 proceeds to block 906.

At block 906, the STATE_PEAK signal is set to be equal to the STATE_SM signal and the process returns to block 902. Thus, transitions of the STATE_PEAK signal are generated at block 906.

At block 904, if the condition is false, then the process 900 realms to block 902.

If at block 902, the condition is true, then the process proceeds to block 908.

At block 908, it is determined if the state indicated by the STATE_SM signal is less than the state indicated by the STATE_PEAK signal. If the condition is true, the process 900 proceeds to block 906, lithe condition is false, the process 900 returns to block 902.

It should be understood that the reduced chatter in the STATE_PEAK signal compared with the chatter in the STATE_SM signal can result in an ability to use state boundaries (see, e.g., 180b of FIG. 2) or states that are more closely spaced than would otherwise be possible. Referring briefly to FIG. 2, the chatter in the STATE_SM signal 174a is influenced by noise in the IDDIFF signal 154a appearing as transitions in the COMP_A signal 172a and in the COMP_B signal 170a, particularly when the applied thresholds, THRESH_A 168a and THRESH_B 168b, are closely spaced. The process 900 of FIG. 17 provides a function that is similar to application of hysteresis to the two comparators 170, 172 of FIG. 2, allowing the two thresholds, THRESH_A 168a and THRESH_B 168b, to be more closely spaced.

Providing states that are more closely spaced allows, in turn, for more accurate (in time edge placement of the POSCOMP signals 112a, 128a of FIG. 1 (refer, for example, to FIGS. 7 and 7A). Since the edges (transitions) of the POSCOMP signals are directly related to absolute rotational angle of the object 100 of FIG. 1, the process 900 of FIG. 17, resulting in the STATE_PEAK signal, provides a more accurate knowledge of the absolute rotational angle of the object 100.

Figure 18:
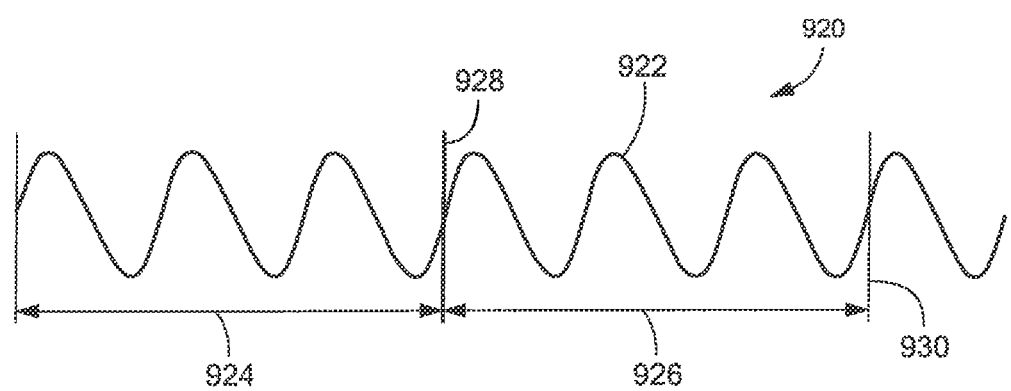
FIG. 18 is a graph showing a DIFF signal and a direction validation window.

Referring now to FIG. 18, a graph 920 has a vertical axis with a scale in arbitrary units of amplitude and a horizontal axis with a scale in arbitrary units of time. A signal 922 is representative of one of the DIFF signals 108a, 124a of FIG. 1, or one of the DDIFF signals 110a, 126a of FIG. 1 but in analog form, or of the IDDIFF signal 154a of FIG. 2 but in analog form.

A first time 928 is representative of a first predetermined number of cycles 924, for example, three cycles after the motion sensor 102 of FIG. 1 is powered up. If no vibrations are detected by the vibration processor 116 of FIG. 1, then, in some embodiments, the output protocol processor 118 of FIG. 1 can generate an active output signal 118a at the time 928 (time 928 can be a valid time). However, if a vibration is detected by the vibration processor 116, then another predetermined number of cycles 926 can be added to the first predetermined number of cycles 924, resulting in the active output signal 118a being delayed until a time 930 (a new valid time). Multiples of the first predetermined number of cycles can be added to the first predetermined number of cycles 924 until such time that the vibration is no longer detected and the active output signal 118a can be delayed accordingly.

This arrangement will be understood to delay the active output signal 118a by an amount that may be unnecessarily long.

It will be recognized that it is desirable to provide an active output signal 118a as quickly as possible.

Figure 18A:
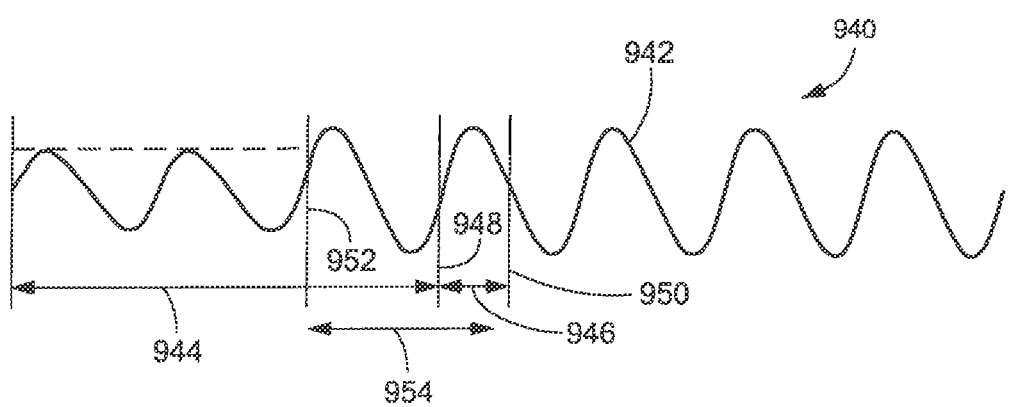
FIG. 18A is a graph showing a DIFF signal and a modified direction validation window.

Referring now to FIG. 18A, a graph 940 has a vertical axis with a scale in arbitrary units of amplitude and a horizontal axis with a scale in arbitrary units of time. A signal 942 is representative of one of the DIFF signals 108a, 124a of FIG. 1, or one of the DDIFF signals 110a, 126a of FIG. 1 but in analog form, or of the IDDIFF signal 154a of FIG. 2 but in analog form.

A first time 948 is representative of a predetermined number of cycles, for example, three cycles after the motion sensor 102 of FIG. 1 is powered up. If, from time zero to the time 948, no vibrations are detected by the vibration processor 116 of FIG. 1 the time 948 is a valid time, and, in some embodiments, the output protocol processor 118 of FIG. 1 can generate a validated output signal, which can be an active output signal 118a, at the time 948, preceded by an unvalidated output signal, which can be an inactive output signal, prior to the time 948.

However, if a vibration is detected by the vibration processor 116, the valid time can occur later than the time 948. A vibration detection is shown to occur at a time 952, where an amplitude change of the DIFF signal 942 occurs.

If a vibration is detected by the vibration processor 116 of FIG. 1 before the time 948 representative of the predetermined number of cycles 944, then a "determined" time period 954 can be added from the time of the detection 952, resulting in the validated output signal 118a being delayed until a time 950, preceded by the unvalidated output signal before the time 950.

In other words, a new valid time occurs at time 950. The determined time period 954 (or number of cycles) can be determined according to particular characteristics of the detected vibration (e.g., type of the vibration, duration of the vibration) as described below in conjunction with FIGS. 19-19B.

In some embodiments, the determined time period 954 can include a number of cycles of the DIFF signal 942, (or POSCOMP signal, not shown) determined according to the particular characteristics of the detected vibration. In other embodiments, the determined time period 954 can be a time period related to the particular characteristics of the detected vibration irrespective of the cycles of the DIFF signal.

This arrangement will be understood to delay the validated output signal 118a by an amount less than the arrangement of FIG. 18, as is desired. In other words, the valid time 950 occurs before the valid time 930 of FIG. 18.

While arrangement described above describe an unvalidated output signal before the time 950 (or 948) to be "inactive" and a validated output signal after the time 950 (or 948) to be "active," it will be understood that the output protocol processor 118 of FIG. 1 can more generally provide the output signal 118a having first characteristics before the time 950 (or 948) (referred to herein as a "valid time"), and it can provide the output signal 118a with second different characteristics after the time 950 (or 948).

In some alternate embodiments, the first characteristics before the valid time 950 (i.e., the unvalidated signal) can include no direction information (but may, in some embodiments, include motion speed information), and the second different characteristics after the time 950 (i.e., the validated signal) can include validated direction information and the motion speed information. In some other alternate embodiments, the first characteristics before the valid time 950 (i.e., the unvalidated signal) can include presumed (unvalidated) direction information and motion speed information, and the second different characteristics after the time 950 (i.e., the validated signal) can include the validated direction information and the motion speed information.

As described above in conjunction with FIG. 1, exemplary output signals with different protocols are described in U.S. patent application Ser. No. 12/183,367, filed Jul. 31, 2008, in U.S. Pat. No. 6,815,944, issued Nov. 9, 2004, and in U.S. Pat. No. 7,026,808, issued Apr. 11, 2006.

Referring now to FIGS. 19-19B, which together describe a process 1000. The process 1000 includes processes running in parallel. A first process includes blocks 1002-1010. A second process includes blocks 1012-1052 (FIGS. 19-19B). The process 1000 can be used to identity the time 950 of FIG. 18A (including the determined time 946 or determined number of cycles 946 added to the predetermined number of cycles 944) at which time the output signal 118a of FIG. 1 becomes active or otherwise becomes indicative of a direction of motion of the object 100 of FIG. 1.

At block 1002, the process 1000 waits for an edge in POSCOMP signal in either channel, right or left. Once an edge is detected in a POSCOMP signal, then the process proceeds to block 1004, where a count (CNT) (of POSCOMP edges) is incremented by one.

At block 1006, it is determined if the count (CNT) is greater than or equal to four. If the count is not greater than or equal to four, then the process 1000 proceeds to block 1008, where a VALID signal is set to zero, and is indicative of the output signal 118a of FIG. 1 not yet being valid, in which case, in some embodiments, an active output signal 118a (FIG. 1) may be suppressed. The process returns to block 1002.

At block 1006, if the count (CNT) is greater than or equal to four, then the VALID signal is set to one, and is indicative of the output signal 118a of FIG. 1 being valid, in which case, the active output signal 118a may be generated. The VALID=1 of block 1010 is representative of a time when the valid time 950 of FIG. 18A occurs.

The parallel process of blocks 1012-1052 either allows the count (CNT) to grow or not to grow to reach a count of four.

At blocks 1012, 1014, 1016, 1018, and 1020, it is determined if a power on signal, the INFLECTION_FLAG signal (FIGS. 3 and 10), the L_INFLECTION_FLAG signal (FIGS. 3 and 10, the DIR_CHANGE_FLAG signal (FIGS. 3 and 11), or the TOO_CLOSE_FLAG signal (FIGS. 3 and 14), respectively, are indicative of a fault condition. If any of the listed signals are indicative of a fault condition, the process proceeds to block 1022, where the count (CNT) is set to zero and the process 1000 returns to block 1002.

If none of the listed signals are indicative of a fault condition, then the process proceeds to blocks 1024, 1026, 1028, and 1030 of FIG. 19A, where it is determined if the DIR_CHANGE_PK_FLAG signal (FIGS. 3 and 12), the DIR_CHANGE_RM_FLAG signal (FIGS. 3 and 13), the R_PEAK_IN_FLAG signal (FIGS. 3 and 15), or the L_PEAK_IN_FLAG signal (FIGS. 3 and 15), respectively, are indicative of a fault condition. If any of the listed signals are indicative of a fault condition, the process proceeds to block 1034, where it is determined if the count (CNT) is greater than one, if the count is greater than one, the process proceeds to block 1032, where the count (CNT) is set to one and the process proceeds to blocks 1036, 1038, 1040, 1042, 1044, 1046, 1048 of FIG. 19B.

If none of the listed signals are indicative of a fault condition, then the process also proceeds to blocks 1036, 1038, 1040, 1042, 1044, 1046, 1048 of FIG. 19B.

At blocks 1036, 1038, 1040, 1042, 1044, 1046, 1048, it is determined if the AMP_DIFF_FLAG signal (FIGS. 3 and 5), the R_PEAK_CLAMP_FLAG signal (FIGS. 3 and 15), the L_PEAK_CLAMP_FLAG signal (FIGS. 3 and 15), the R_POSCOMP_OK_FLAG signal (FIGS. 3 and 16), the L_POSCOMP_OK_FLAG signal (FIGS. 3 and 16), the R_POSCOMP_PK_OK_FLAG signal (FIGS. 3 and 16A), or the L_POSCOMP_PK_OK_FLAG signal (FIGS. 3 and 16A), respectively, are indicative of a fault condition. If any of the listed signals are indicative of a fault condition, the process proceeds to block 1050, where it is determined if the count (CNT) is greater than two.

If, at block 1050, the count (CNT) is greater than two, the process proceeds to block 1052, where the count (CNT) is set to two and the process returns to block 1002 of FIG. 19. If at block 1052, the count (CNT) is not greater than two, the process also returns to block 1002.

If none of the listed signals are indicative of a fault condition, then the process also proceeds to block 1002.

It will be appreciated that particular vibration sub-processors are described in FIG. 3, outputs of which are used in the process of FIGS. 19-19B. Other vibration sub-processors and associated processes can also be used. The outputs of the vibrations sub-processors can also be used with logic different than that of FIGS. 19-19B to identify the determined time 946 of FIG. 18B.

In processes described above, various delay times, various count values, various amplitude windows, and various other numerical parameters are described. It will be appreciated that the processes above can depart from the specific numerical parameters described without departing from the invention.

Having described preferred embodiments of the invention it will now become apparent to those of ordinary skill in the art that other embodiments incorporating these concepts may be used. Additionally, the software included as part of the invention may be embodied in a computer program product that includes a computer readable storage medium. For example, such a computer readable storage medium can include a readable memory device, such as a hard drive device, a CD-ROM, a DVD-ROM, or a computer diskette, having computer readable program code segments stored thereon. A computer readable transmission medium can include a communications link, either optical, wired, or wireless, having program code segments carried thereon as digital or analog signals. Accordingly, it is submitted that that the invention should not be limited to the described embodiments but rather should be limited only by the spirit and scope of the appended claims.

All patents, patent applications, publications, and references cited herein are expressly incorporated herein by reference in their entirety.

What is claimed is:

1. A motion sensor, comprising:
   a magnetic field sensing element configured to generate a magnetic field signal indicative of a magnetic field associated with an object; and
   a state processor coupled to receive a signal representative of the magnetic field signal, wherein the state processor is configured to generate a STATE_SM signal indicative of a plurality of states associated with the magnetic field signal, wherein the plurality of states is indicative of a respective range of signal values of the magnetic field signal, wherein the STATE_SM signal comprises a plurality of state transitions, wherein the plurality of state transitions is comprising state transition chatter, and wherein the state processor comprises:
   a state peak logic module coupled to receive the STATE_SM signal and configured to generate a STATE_PEAK signal, wherein the STATE_PEAK signal comprises a plurality of state peak transitions, wherein the plurality of state peak transitions has reduced state transition chatter,
   wherein the state peak logic module is further coupled to receive a POSCOMP_PK signal having state transitions that occur when a state represented by the STATE_PEAK signal differs from a state represented by the STATE_SM signal by a predetermined number of states, and wherein the state peak logic module comprises a state peak logic processor configured, if the POSCOMP_PK signal is equal to a first state, and a state value of the STATE_SM signal is greater than a state value of the STATE_PEAK signal, to set a state value of the STATE_PEAK signal to equal a state value of the STATE_SM signal.

2. The motion sensor of claim 1, wherein the state peak logic processor is further configured, if the POSCOMP_PK signal has a second different state, and a state value of the STATE_SM signal is less than a state value of the STATE_PEAK signal, to also set a state value of the STATE_PEAK signal to equal a state value of the STATE_SM signal.

3. The motion sensor of claim 1, wherein states values of the STATE_SM signal are held in a STATE_SM register and wherein state values of the STATE_PEAK signal are held in an SM_PEAK register.

4. The motion sensor of claim 1, further comprising a vibration processor coupled to the state processor, wherein the vibration processor comprises an inflection processor configured to generate a two-state POSCOMP_PK signal having state transitions that occur when a state represented by the STATE_PEAK signal differs from a state represented by the STATE_SM signal by a predetermined number of states.

5. The vibration processor of claim 4, wherein the inflection processor is further configured, if the POSCOMP_PK signal has a state transition, and if the state value represented by the STATE_SM signal is less than a first predetermined state value or greater than, a second predetermined state value, to change a state of an INFLECTION_FLAG signal.

6. The motion sensor of claim 4, wherein the state peak logic module comprises a state peak logic processor configured, if the POSCOMP_PK signal is equal to a first state, and a state value of the STATE_SM signal is greater than a state value of the STATE_PEAK signal, to set a state value held in a STATE_PEAK register to equal a state value held in a STATE_SM register, wherein the state peak logic processor is further configured, if the POSCOMP_PK signal is equal to a second different state, and a state value of the STATE_SM signal is less than a state value of the STATE_PEAK signal, to also set a state value held in the STATE_PEAK register to equal a state value held in the STATE_SM register.

7. The motion sensor of claim 4, wherein the vibration processor is configured to generate a vibration signal indicative of a vibration of at least one of the object or the plurality of magnetic field sensing elements in response to at least one of the STATE_PEAK signal, the STATE_SM signal, or the POSCOMP_PK signal.

8. The motion sensor of claim 4, wherein the state processor is further configured to generate a two-state POSCOMP signal having first and second different state transitions that occur when at least one of the STATE_SM signal or the STATE_PEAK signal are representative of respective first and second states.

9. The motion sensor of claim 8, wherein the first and second states are different states.

10. The motion sensor of claim 8, wherein the vibration processor is configured to generate a vibration signal indicative of a vibration of at least one of the object or the plurality of magnetic field sensing elements in response to at least one of the STATE_PEAK signal, the STATE_SM signal, the POSCOMP signal, or the POSCOMP_PK signal.

11. A method of detecting a motion of an object, comprising:
generating a magnetic field signal indicative of a magnetic field associated with the object;
generating a STATE_SM signal indicative of a plurality of states associated with the magnetic field signal, wherein each one of the plurality of states is indicative of a respective range of signal values of the magnetic field signal, wherein the STATE_SM signal comprises a plurality state transitions, wherein the plurality of state is comprising state transition chatter;
generating a STATE_PEAK signal related to the STATE_SM signal, wherein the STATE_PEAK signal comprises a plurality state peak transitions, wherein the plurality of state peak transitions has reduced state transition chatter;
generating a POSCOMP_PK signal having state transitions that occur when a state represented by the STATE_PEAK signal differs from a state represented by the STATE_SM signal by predetermined number of states, and
if the POSCOMP_PK signal is equal to a first state, and a state value of the STATE_SM signal is greater than a state value of the STATE_PEAK signal, setting a state value of the STATE_PEAK signal to equal a state value of the STATE_SM signal.

12. The method of claim 11, further comprising:
if the POSCOMP_PK signal has a second different state, and a state value of the STATE_SM signal is less than a state value of the STATE_PEAK signal, also setting a state value of the STATE_PEAK signal to equal a state value of the STATE_SM signal.

13. The method of claim 11, further comprising:
holding states values of the STATE_SM signal in a STATE_SM register; and
holding values of the STATE_PEAK signal in an SM_PEAK register.

14. The method of claim 13, further comprising:
generating a two-state POSCOMP_PK signal having state transitions that occur when a state represented by the STATE_PEAK signal differs from a state represented by the STATE_SM signal by a predetermined number of states.

15. The method of claim 14, further comprising:
if the POSCOMP_PK signal has a state transition, and if the state value represented by the STATE_SM signal is less than a first predetermined state value or greater than a second predetermined state value, changing a state of an INFLECTION_FLAG signal.

16. The method of claim 14, further comprising:
if the POSCOMP_PK signal is equal to a first state, and a state value of the STATE_SM signal is greater than a state value of the STATE_PEAK signal, setting a state value held in a STATE_PEAK register to equal a state value held in a STATE_SM register; and
if the POSCOMP_PK signal is equal to a second different state, and a state value of the STATE_SM signal is less than a state value of the STATE_PEAK, setting a state value held in the STATE_PEAK register to equal a state value held in the STATE_SM register.

17. The method of claim 14, further comprising:
generating a vibration signal indicative of a vibration of at least one of the object or the plurality of magnetic field sensing elements in response to at least one of the STATE_PEAK signal, the STATE_SM signal, or the POSCOMP_PK signal.

18. The method of claim 14, further comprising:
generating a two-state POSCOMP signal having first and second different state transitions that occur when at least one of the STATE_SM signal or the STATE_PEAK signal are representative of respective first and second states.

19. The method of claim 18, wherein the first and second states are different states.

20. The method of claim 12, further comprising:
generating a vibration signal indicative of a vibration of at least one of the object or the plurality of magnetic field sensing elements in response to at least one of the STATE_PEAK signal, the STATE_SM signal, the POSCOMP signal, or the POSCOMP_PK signal.

21. A non-transitory computer-readable storage medium having computer readable code thereon for providing sensing of a motion of an object, the medium comprising:
instructions for receiving a magnetic field signal indicative of a magnetic field associated with the object;
instructions for generating a STATE_SM signal indicative of a plurality of states associated with the magnetic field signal, wherein each one of the plurality of states is indicative of a respective range of signal values of the magnetic field signal, wherein the STATE_SM signal comprises a plurality of state transitions, wherein the plurality of state transitions is comprising state transition chatter;
instructions for generating a STATE_PEAK signal related to the STATE_SM signal, wherein the STATE_PEAK signal comprises a plurality of state peak transitions, wherein the plurality of state peak has reduced state transition chatter;
instructions for generating a POSCOMP_PK signal having state transitions that occur when a state represented by the STATE_PEAK signal differs from a state represented by the STATE_SM signal by a predetermined number of states, and
instructions for, if the POSCOMP_PK signal is equal to a first state, and a state value of the STATE_SM signal is greater than a state value of the STATE_PEAK signal, setting a state value of the STATE_PEAK signal to equal a state value of the STATE_SM signal.

22. The computer-readable storage medium of claim 21, further comprising:
instructions for, if the POSCOMP_PK signal has a second different state, and a state value of the STATE_SM signal is less than a state value of the STATE_PEAK signal, also setting a state value of the STATE_PEAK signal to equal a state value of the STATE_SM signal.

23. The computer-readable storage medium of claim 21, further comprising:
  instructions for holding states values of the STATE_SM signal in a STATE_SM register; and
  instructions for holding values of the STATE_PEAK signal in an SM_PEAK register.

24. The computer-readable storage medium of claim 23, further comprising:
  instructions for generating a vibration signal indicative of a vibration of at least one of the object or the plurality of magnetic field sensing elements in response to at least one of the STATE_PEAK signal, the STATE_SM signal, or the POSCOMp_PK.

25. The computer-readable storage medium of claim 23, further comprising:
  instructions for generating a two-state POSCOMP signal having first and second different state transitions that occur when at least one of the STATE_SM signal or the STATE_PEAK signal are representative of respective first and second states.

26. The computer-readable storage medium of claim 25, wherein the first and second states are different states.

27. The computer-readable storage medium of claim 25, further comprising:
  instructions for generating a vibration signal indicative of a vibration of at least one of the object or the plurality of magnetic field sensing elements in response to at least one of the STATE_PEAK signal, the STATE_SM signal, the POSCOMP signal, or the POSCOMP_PK signal.

28. The computer-readable storage medium of claim 21, further comprising:
  instructions for generating a two-state POSCOMP_PK signal having state transitions that occur when a state represented by the STATE_PEAK signal differs from a state represented by the STATE_SM signal by a predetermined number of states.

29. The computer-readable storage medium of claim 28, further comprising:
  instructions for, if the POSCOMP_PK signal has a state transition, and if the state value represented by the STATE_SM signal is less than a first predetermined state value or greater than a second predetermined state value, changing a state of an INFLECTION_FLAG signal.

30. The computer-readable storage medium of claim 28, further comprising:
  instructions for, if the POSCOMP_PK signal is equal to a first state, and a state value of the STATE_SM signal is greater than a state value of the STATE_PEAK, setting a state value held in a STATE_PEAK register to equal a state value held in a STATE_SM register; and
  instructions for, if the POSCOMP_PK signal is equal to a second different state, and a state value of the STATE_SM signal is less than a state value of the STATE_PEAK, setting a state value held in the STATE_PEAK register to equal a state value held in the STATE_SM register.

* * * * *